US012677542B2

(12) United States Patent
Jung

(10) Patent No.: US 12,677,542 B2
(45) Date of Patent: Jul. 7, 2026

(54) DISPLAY PANEL AND ELECTRONIC APPARATUS INCLUDING THE SAME

(71) Applicant: Samsung Display Co., Ltd., Yongin-Si (KR)

(72) Inventor: Inyoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 18/523,901

(22) Filed: Nov. 30, 2023

(65) Prior Publication Data

US 2024/0188342 A1 Jun. 6, 2024

(30) Foreign Application Priority Data

Dec. 5, 2022 (KR) ........................ 10-2022-0168128

(51) Int. Cl.
| | |
|---|---|
| *H10K 59/122* | (2023.01) |
| *H10K 59/12* | (2023.01) |
| *H10K 59/131* | (2023.01) |
| *H10K 50/81* | (2023.01) |
| *H10K 50/822* | (2023.01) |
| *H10K 50/844* | (2023.01) |
| *H10K 59/123* | (2023.01) |
| *H10K 59/124* | (2023.01) |
| *H10K 59/60* | (2023.01) |
| *H10K 59/65* | (2023.01) |

(52) U.S. Cl.
CPC ....... *H10K 59/122* (2023.02); *H10K 59/1201* (2023.02); *H10K 59/131* (2023.02)

(58) Field of Classification Search
CPC ............. H10K 59/122; H10K 59/1201; H10K 59/131; H10K 59/124; H10K 59/12; H10K 50/81; H10K 50/822; H10K 50/844; H10K 59/123; H10K 59/60; H10K 59/65
See application file for complete search history.

(56) References Cited

U.S. PATENT DOCUMENTS

| | | | |
|---|---|---|---|
| 9,355,593 B2 | 5/2016 | Jeong et al. | |
| 11,348,983 B1 | 5/2022 | Choung et al. | |
| 2007/0263164 A1* | 11/2007 | Kumagai ............. | H10K 59/122 349/156 |

(Continued)

FOREIGN PATENT DOCUMENTS

| | | |
|---|---|---|
| JP | 2016-225319 A | 12/2016 |
| KR | 10-1875123 B1 | 7/2018 |

*Primary Examiner* — Sue A Purvis
*Assistant Examiner* — Jaime Lynn Sprenger
(74) *Attorney, Agent, or Firm* — Innovation Counsel LLP

(57) ABSTRACT

Provided is a display panel including sub-pixel electrodes and a metal bank layer on the sub-pixel electrodes, the metal bank layer including openings on the sub-pixel electrodes and a groove between the sub-pixel electrodes. An insulating layer is on the sub-pixel electrodes and between the sub-pixel electrodes, a bridge line is on the insulating layer between the sub-pixel electrodes, including the same material as a material of the metal bank layer, an intermediate layer is on the sub-pixel electrodes through the opening of the metal bank layer, and an opposite electrode disposed on the intermediate layer in the openings of the metal bank layer wherein, in a plan view, the groove is configured to surround at least a portion of the bridge line.

24 Claims, 22 Drawing Sheets

113(1113, 2113, 3113), 210(1210, 2210, 3210)   ED1(1210, 1220, 1230)
220(1220, 2220, 3220), 230(1230, 2230, 3230)   ED2(2210, 2220, 2230)
510(1510, 2510, 3510), 500(510, 520, 530)       ED3(3210, 3220, 3230)

(56) References Cited

U.S. PATENT DOCUMENTS

| | | | |
|---|---|---|---|
| 2016/0149156 A1* | 5/2016 | Kim ..................... | H10K 59/121 |
| | | | 438/46 |
| 2020/0006661 A1* | 1/2020 | Shinokawa .......... | B23K 26/362 |
| 2022/0077252 A1 | 3/2022 | Choung et al. | |
| 2022/0077257 A1* | 3/2022 | Choung .............. | H10K 59/173 |

* cited by examiner

DL1(DL1a, DL1b), DL2(DL2a, DL2b)
DL3(DL3a, DL3b), DL4(DL4a, DL4b)
BL1(HB1, VB1, HB1'), BL2(HB2, VB2, HB2')
BL3(HB3, VB3, HB3'), BL4(HB4, VB4, HB4')
SL1(SL1a, SL1b), SL2(SL2a, SL2b)
DL(DL1, DL2, DL3, DL4), BL(BL1, BL2, BL3, BL4)
SL(SL1, SL2)

113(4113, 5113), 210(4210, 5210)    ED4(4210, 4220, 4230)
220(4220, 5220), 230(4230, 5230)    ED5(5210, 5220, 5230)
510(4510, 5510), 500(510, 520, 530)

DISPLAY PANEL AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2022-0168128 filed on Dec. 5, 2022 in the Korean Intellectual Property Office, the disclosure of which is incorporated by reference herein in its entirety.

BACKGROUND

1. Field

This disclosure relates to a display panel and a structure of an electronic apparatus including the display panel.

2. Description of the Related Art

In display panels such as organic light emitting display panels, thin film transistors are arranged in a display area to control the brightness of a light emitting diode. The thin film transistors control the light emitting diode to emit light having a certain color by using a transmitted data signal, a driving voltage, and a common voltage.

A data driving circuit, a driving voltage supply line, a common voltage supply line, and the like are located in a non-display area outside the display area in order to provide a data signal, a driving voltage, a common voltage, and the like.

SUMMARY

One or more embodiments provide an electronic apparatus that may provide images having high quality while having a reduced dead space. However, these advantages are merely illustrative, and the scope of the present disclosure is not limited thereby.

Additional aspects will be set forth in part in the description which follows and, in part, will be apparent from the description, or may be learned by practice of the presented embodiments of the disclosure.

According to an aspect of the present disclosure, a display panel includes sub-pixel electrodes, a metal bank layer on the sub-pixel electrodes, the metal bank layer comprising openings on the sub-pixel electrodes and a groove between sub-pixel electrodes, the metal bank layer being absent in the openings and the groove. An insulating layer is on the sub-pixel electrodes and under the metal bank layer, and a bridge is disposed on the insulating layer between the sub-pixel electrodes, wherein the bridge line includes the same material as the metal bank layer. An intermediate layer is on the sub-pixel electrodes in the opening of the metal bank layer, and an opposite electrode is disposed on the intermediate layer in the opening of the metal bank layer, wherein, in a plan view, the groove surrounds at least a portion of the bridge line.

The opposite electrode may be in contact with a side surface of the metal bank layer.

Each of the metal bank layer and the bridge line may include a first metal layer and a second metal layer having different compositions.

A portion of the second metal layer of the metal bank layer may include a tip extending from a point where a bottom surface of the second metal layer and a side surface of the first metal layer contact each other, toward each of the opening and the groove.

The groove extends between the bridge line and the metal bank layer.

The display panel may further include a substrate including a transmission area and a display area surrounding the transmission area, and the bridge line may be disposed adjacent to the transmission area and may surround at least a portion of the transmission area.

The display panel may further include a thin film transistor electrically connected to a light emitting diode, wherein the light emitting diode includes at least one of the sub-pixel electrodes, the intermediate layer, and the opposite electrode, and a scan line and a data line configured to supply a signal to the thin film transistor, wherein the scan line may extend in a first direction, and the data line may extend in a second direction crossing the first direction, and the bridge line may be electrically connected to the data line.

Some of the data lines may be spaced apart from each other with the transmission area therebetween and may be separated into a first portion of the data line and a second portion of the data line, and the bridge line may be configured to electrically connect the first portion of the data line and the second portion of the data line.

The data line and the bridge line may be disposed on different layers, and the data line and the bridge line may be connected to each other through a contact hole in an insulating layer between the data line and the bridge line.

The contact hole may be disposed around the transmission area.

The display panel may further include a conductive metal between a portion of the bridge line and a portion of the data line, wherein a portion of the bridge line and a portion of the data line may be electrically connected to each other by the conductive metal.

The bridge line may include a horizontal bridge line extending in the first direction and a vertical bridge line extending in the second direction.

The horizontal bridge line and the vertical bridge line may be arranged on the same layer, and the horizontal bridge line and the vertical bridge line may be integrally formed with each other.

The display panel may further include a first inorganic encapsulation layer configured to cover at least a portion of an inner surface of the opening of the metal bank layer, an organic encapsulation layer on the first inorganic encapsulation layer, and a second inorganic encapsulation layer on the organic encapsulation layer, wherein the insulating layer and the organic encapsulation layer may be in direct contact with each other through the groove in the metal bank layer.

According to another aspect of the present disclosure, an electronic apparatus includes a display panel including a transmission area and a display area surrounding the transmission area and a component disposed on a rear surface of the display panel and corresponding to the transmission area, wherein the display panel includes sub-pixel electrodes, a metal bank layer on the sub-pixel electrodes, the metal bank layer including openings on the sub-pixel electrodes and a groove between sub-pixel electrodes, the metal bank layer being absent in the openings and the groove. There are an insulating layer on the sub-pixel electrodes and under the metal bank layer, a bridge line disposed on the insulating layer between the sub-pixel electrodes, wherein the bridge line includes the same material as the metal bank layer, an intermediate layer on the sub-pixel electrodes in the opening of the metal bank layer, and an opposite electrode disposed on the intermediate layer in the opening of the metal bank layer, wherein the bridge line is spaced apart from the metal bank layer with the groove therebetween.

The opposite electrode may be in contact with the side surface of the metal bank layer.

Each of the metal bank layer and the bridge line may include a first metal layer and a second metal layer having different compositions, and a portion of the second metal layer may include a tip extending from a point where a bottom surface of the second metal layer and a side surface of the first metal layer contact each other, toward each of the opening and the groove.

The bridge line may be disposed adjacent to the transmission area and may surround at least a portion of the transmission area.

The display panel may further include a thin film transistor electrically connected to a light emitting diode, wherein the light emitting diode includes at least one of the sub-pixel electrodes, the intermediate layer, and the opposite electrode, and a scan line and a data line configured to supply a signal to the thin film transistor, wherein the scan line may extend in a first direction, and the data line may extend in a second direction crossing the first direction, and the bridge line may be electrically connected to the data line.

Some of the data lines may be spaced apart from each other with the transmission area therebetween and may be separated into a first portion of the data line and a second portion of the data line, and the bridge line may be configured to electrically connect the first portion of the data line and the second portion of the data line.

The data line and the bridge line may be disposed on different layers, and the data line and the bridge line may be connected to each other through a contact hole in an insulating layer between the data line and the bridge line.

The electronic apparatus may further include a conductive metal between a portion of the bridge line and a portion of the data line, wherein a portion of the bridge line and a portion of the data line may be electrically connected to each other by the conductive metal.

The bridge line may include a horizontal bridge line extending in the first direction and a vertical bridge line extending in the second direction, and the horizontal bridge line and the vertical bridge line may be disposed on the same layer, and the horizontal bridge line and the vertical bridge line may be integrally formed with each other.

The component may include a sensor or a camera.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
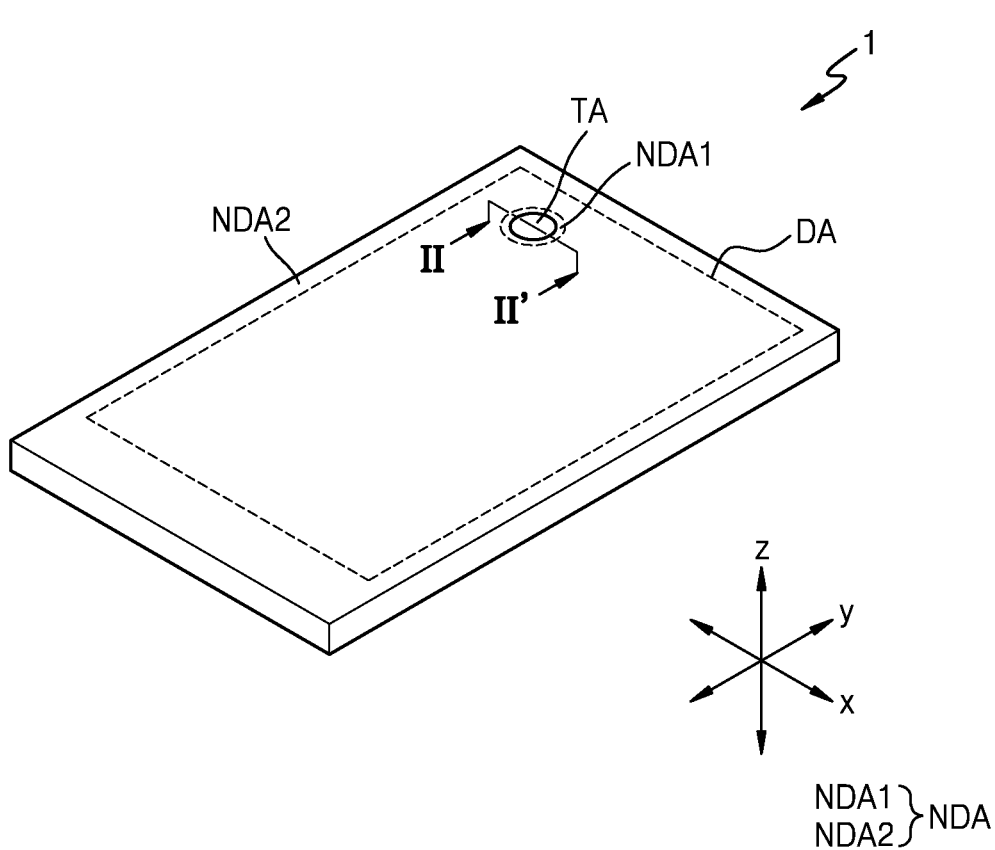
FIGS. 1A and 1B are perspective views schematically illustrating an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

Hereinafter, embodiments of the present disclosure will be described in detail with reference to the accompanying drawings, and the same or corresponding components are denoted by the same reference numerals, and the same reference numerals are assigned and redundant explanations will be omitted.

In the following embodiment, the terms of the first and second, etc. were used for the purpose of distinguishing one component from other components, not a limited sense.

In the following embodiment, the singular expression includes a plurality of expressions unless the context is clearly different.

In the following embodiment, terms such as "comprising" or "having" are meant to refer to the features described in the specification without excluding the possibility of one or more additional features or components being present.

In the following embodiment, when a portion such as a layer, a region, a component or the like is "on" other portions, this refers to the possibility of portions being in contact with each other as well as there being other components interposed therebetween.

In the drawings, for convenience of explanation, the sizes of components may be exaggerated or reduced. Since the size and thickness of each component shown in the drawings are arbitrarily indicated for convenience of explanation, the present disclosure is not necessarily limited to the illustration.

Where a process is disclosed, a specific process is not limited to being executed in the exact order that is described. For example, two processes described sequentially may be performed at the same time, or in an order that is in reverse order of the order in which the process is described.

In the present specification, when a layer, a region, a component, etc. are connected to each other, the layer, the region, and the components may be directly connected to each other and/or the layer, the region, and the components may be indirectly connected to each other with other layers, other regions and other components interposed between the layer, the region, and the components. For example, when a layer, a region, a component, etc. are electrically connected to each other in the present specification, the layer, the region, the component, etc. may be directly electrically connected to each other without intervening parts, and/or the layer, the region, the component, etc. may be indirectly electrically connected to each other with other layers, other regions and other components interposed between the layer, the region, and the components.

Figure 1B:
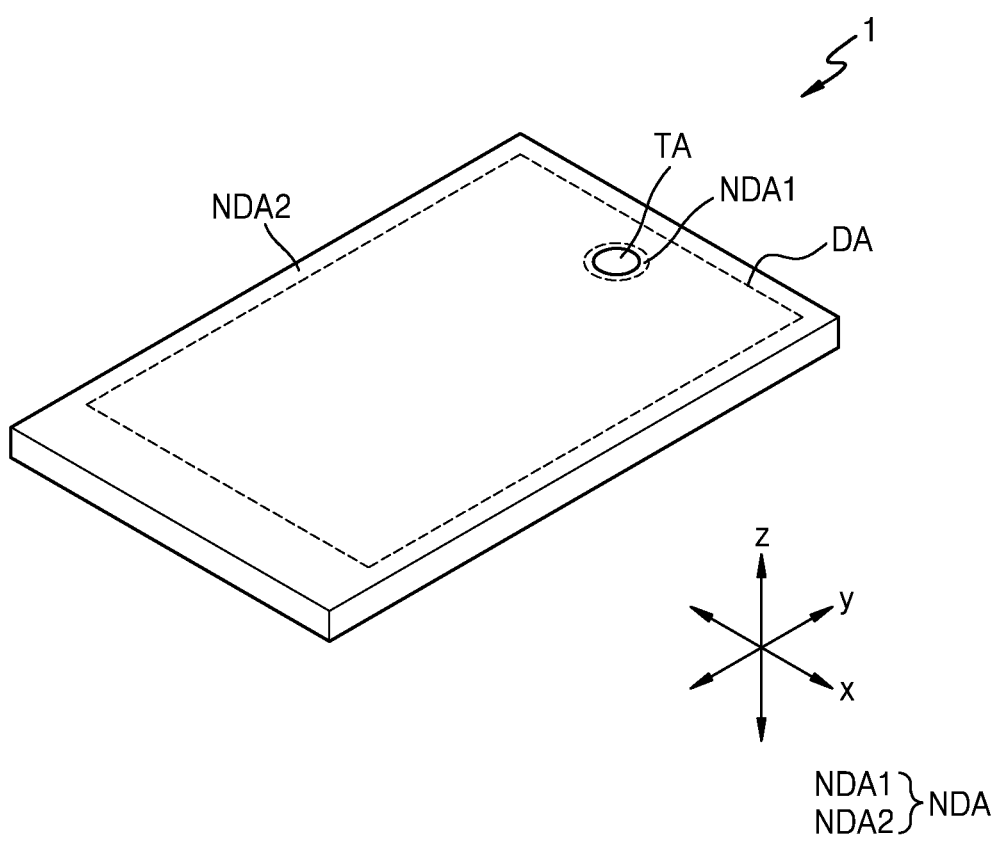

FIGS. 1A and 1B are perspective views schematically illustrating an electronic apparatus according to an embodiment.

Referring to FIGS. 1A and 1B, an electronic apparatus 1 according to an embodiment may be an apparatus for displaying a moving image or still image, and may be used as a screen display for various products such as portable electronic apparatuses such as mobile phones, smart phones, tablet personal computers (PCs), mobile communication terminals, electronic notebooks, electronic books, portable multimedia players (PMPs), navigation systems, ultra mobile PCs (UMPCs), and the like, and televisions, laptop computers, monitors, advertisement boards, Internet of Things (IOTs), and the like. In addition, the electronic apparatus 1 according to an embodiment may be used in a wearable device such as a smart watch, a watch phone, a glasses-type display, and a head mounted display (HMD). In addition, the electronic apparatus 1 according to an embodiment may be used as an instrument panel of a vehicle, and a center information display (CID) display disposed on a center fascia or a dashboard of a vehicle, a room mirror display for replacing a side mirror of a vehicle, and a display disposed on the rear surface of the front seat. Hereinafter, the electronic apparatus 1 according to an embodiment is used as a smart phone for convenience of explanation.

In the plan view of the present specification, "left," "right," "upper," and "lower," indicate a direction when viewing the electronic apparatus 1 from the top surface referring to the orientation depicted in FIG. 1A (also referred to as the "front"). For example, "left" refers an −x direction, "right" indicates a +x direction, "upper" refers to a +y direction, and "lower" indicates a −y direction. The z-direction would be the thickness direction.

The electronic apparatus 1 may have a rectangular shape in a plan view. For example, the electronic apparatus 1 may have a rectangular planar shape having short sides in the x direction and long sides in the y direction, as shown in FIGS. 1A and 1B. A corner where short sides in the x direction meet long sides in the y direction may be rounded or formed at a right angle to have a certain curvature. The planar shape of the electronic apparatus 1 is not limited to a rectangle, and may be formed in other polygonal, elliptical, or atypical shapes.

The electronic apparatus 1 may include at least one transmission area TA inside the display area DA. FIGS. 1A and 1B illustrate one transmission area TA, but the electronic apparatus 1 may include two or more transmission areas TA. The transmission area TA may be entirely surrounded by the display area DA. The transmission area TA may be an area in which components to be described below with reference to FIG. 2 are arranged, and the electronic apparatus 1 may have various functions by using the components.

In FIG. 1A, a transmission area TA is disposed at an upper left side when viewed from the front, but embodiments are not limited thereto. According to another embodiment, the transmission area TA may be arranged in the center of an upper side as shown in FIG. 1B. Alternatively, according to another embodiment, the transmission area TA may be variously positioned as disposed on the upper right side or at the center of the display area DA.

The display area DA may provide a certain image by using light emitted from a plurality of sub-pixels arranged in the display area DA. Each sub-pixel may include a display element that emits light of a certain color. For example, display elements that emit red, green or blue light may be two-dimensionally arranged in the x direction and the y direction, and the display area DA in which an image is displayed, may be defined.

The non-display area NDA may be an area in which sub-pixels are not arranged, and may include a first non-display area NDA1 for surrounding the transmission area TA and a second non-display area NDA2 for surrounding the display area DA. The first non-display area NDA1 may be disposed between the transmission area TA and the display area DA, and the second non-display area NDA2 may be outside the display area DA.

Figure 2A:
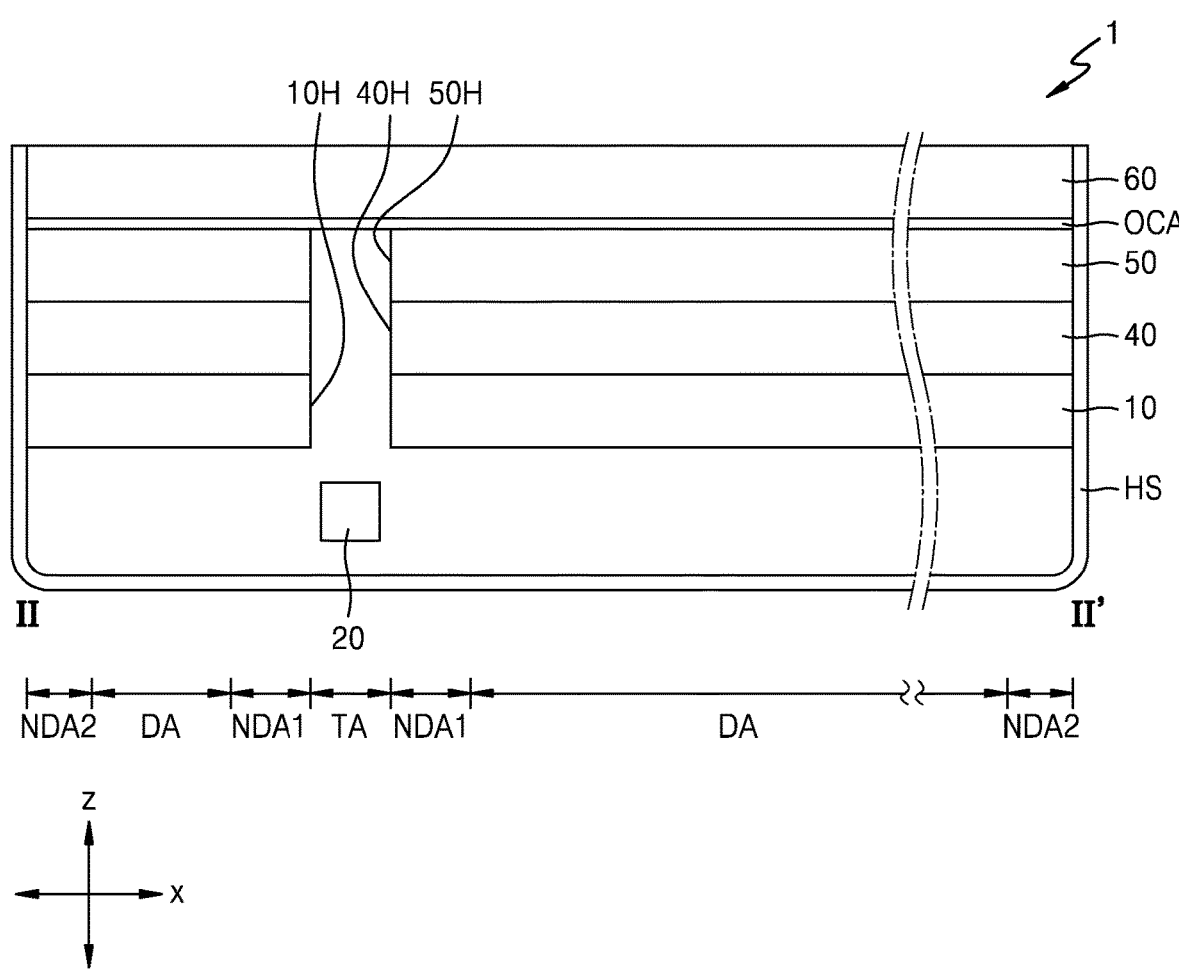
FIGS. 2A and 2B are cross-sectional views of the electronic apparatus taken along a line II-II' of FIG. 1A according to an embodiment.
Figure 2B:
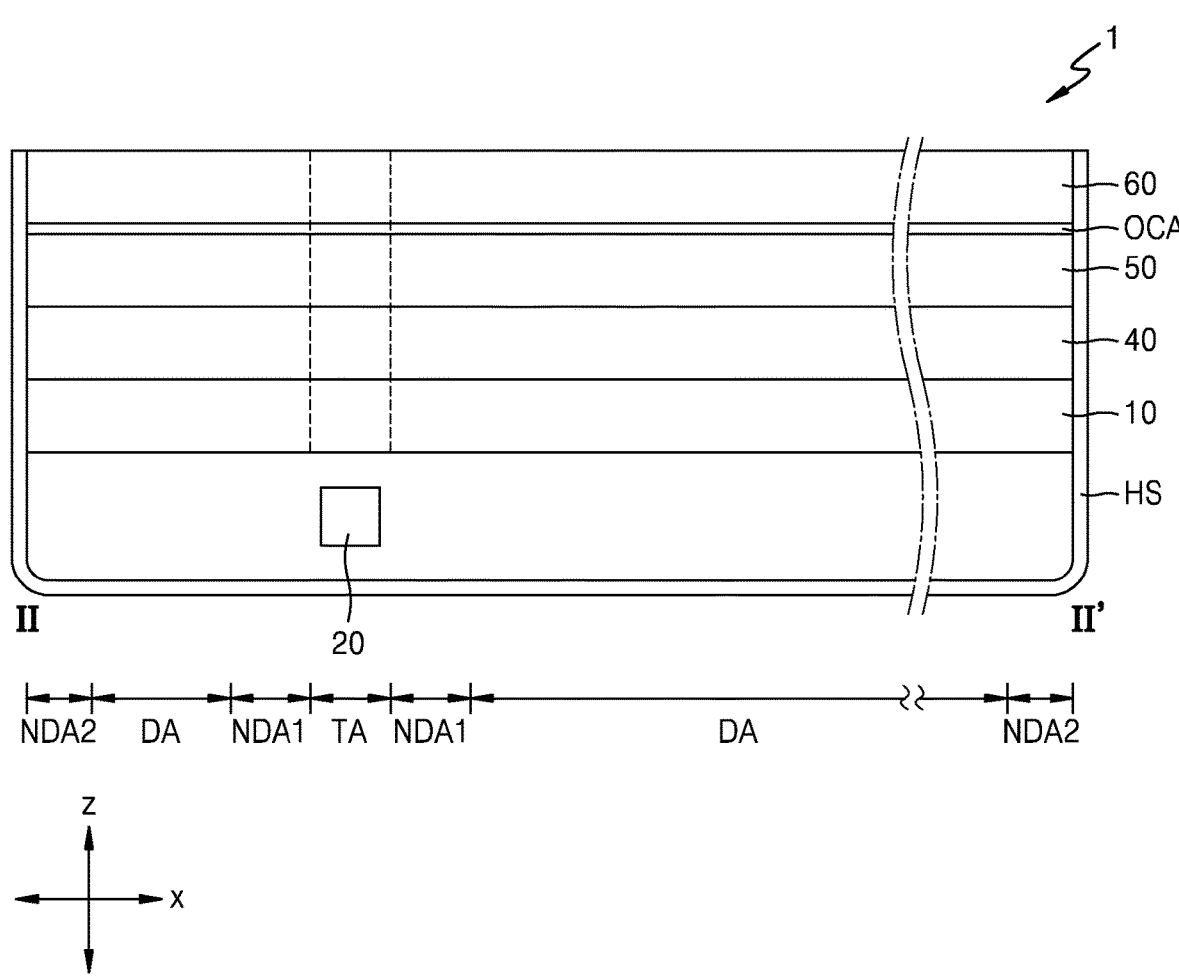

FIGS. 2A and 2B are cross-sectional views of the electronic apparatus taken along a line II-II' of FIG. 1 according to an embodiment. FIGS. 2A and 2B illustrate a cross-section taken along a line II-II' of FIG. 1A, but the cross-sectional structure of FIG. 1B may have the same structure as the structure described in FIGS. 2A and 2B.

Referring to FIGS. 2A and 2B, the electronic apparatus 1 may include a housing HS having one open side and a space therein. The one open side of the housing HS may be coupled to a window 60.

A display panel 10, an input sensing layer 40, and an optical functional layer 50 may be arranged on a rear surface of the window 60, and a component 20 may be disposed on a rear surface of the display panel 10.

The component 20 may be an electronic element using light or sound. The electronic element may include a sensor for measuring a distance such as a proximity sensor, a sensor for recognizing a part (e.g., a fingerprint, an iris, a face, etc.) of the user's body, a small lamp for outputting light, or a camera. The electronic element using light may use pieces of light having various wavelength bands, such as visible lights, infrared rays, or ultraviolet rays. The electronic element using sound may use ultrasonic waves or sound having different frequency bands.

The display panel 10 may display an image. The display panel 10 may display an image by using display elements arranged in the display area DA. The display panel 10 may be a light emitting display panel including a light emitting diode. The light emitting diode may include an organic light emitting diode including an organic light emitting layer. In some embodiments, the light emitting diode may be an inorganic light emitting diode including an inorganic material. The inorganic light emitting diode may include a PN junction diode including materials based on an inorganic material semiconductor. When a voltage is applied to the PN junction diode in a forward direction, holes and electrons are injected, and energy generated by recombination of the holes and electrons is converted into light energy to emit light of a certain color. The above-described inorganic light emitting diode may have a width of several to several hundreds of micrometers or several to several hundreds of nanometers, and in some embodiments, the inorganic light emitting diode may be referred to as a micro LED. A light emitting layer of the light emitting diode may include the above-described organic material or inorganic material. However, in another embodiment, the light emitting layer of the light emitting diode may include quantum dots. In other words, the light emitting diode may be a quantum dot light emitting diode.

The display panel 10 may be a rigid display panel that has rigidity and that is not easily bent, or a flexible display panel that has flexibility and that may be easily bent, folded or rolled. For example, the display panel 10 may be a foldable display panel which may be folded and unfolded, a curved display panel of which a display surface is bent, a bent display panel in which an area other than the display surface is bent, a rollable display panel which may be rolled or unfolded, and a stretchable display panel.

The input sensing layer 40 may attain coordinate information according to an external input, for example, a touch event. The input sensing layer 40 may include a sensing electrode or touch electrode and trace lines connected to the sensing electrode or the touch electrode. The input sensing layer 40 may be disposed on the display panel 10. The input sensing layer 40 may sense an external input using a mutual cap method or/and self cap method.

The input sensing layer 40 may be directly formed on the display panel 10. For example, the input sensing layer 40 may be continuously formed after a process of forming the display panel 10 is performed. In this case, the adhesive layer may not be disposed between the input sensing layer 40 and the display panel 10. Alternatively, the input sensing layer 40 may be coupled to the display panel 10 by using the adhesive layer separately formed. The adhesive layer may include an optical clear adhesive (OCA).

The optical functional layer 50 may include an anti-reflection layer. The anti-reflection layer may reduce the reflectivity of incident light (external light) toward the display panel 10 from the outside through the window 60. The anti-reflection layer may include a retarder and a polarizer.

In another embodiment, the anti-reflection layer may include a black matrix and color filters. The color filters may be arranged in consideration of colors of pieces of light emitted from sub-pixels of the display panel 10. In another embodiment, the anti-reflective layer may include a destructive interference structure. The destructive interference structure may include a first reflection layer and a second reflection layer, which are arranged in different layers. The first reflected light and the second reflected light respectively reflected by the first reflection layer and the second reflection layer may destructively interfere with each other, thereby reducing external light reflectivity.

The optical functional layer 50 may include a lens layer. The lens layer may improve emission efficiency of light emitted from the display panel 10 or may reduce color deviation. The lens layer may include a layer having a concave or convex lens shape and/or may include a plurality of layers having different refractive indexes. The optical functional layer 50 may include all of the above-described anti-reflection layer and lens layer or may include one thereof.

The optical functional layer 50 may be coupled to the window 60 through the adhesive layer such as the OCA.

In some embodiments, the display panel 10, the input sensing layer 40 and/or the optical functional layer 50 may include a through hole located in the transmission area TA. In this regard, FIG. 2A illustrates that each of the display panel 10, the input sensing layer 40 and the optical functional layer 50 includes first, second, and third through holes 10H, 40H and 50H, respectively. The first through hole 10H may pass through the display panel 10 from an upper surface of the display panel 10 toward a lower surface thereof, and the second through hole 40H may pass through the input sensing layer 40 from an upper surface of the input sensing layer 40 toward a lower surface thereof, and the third through hole 50H may pass through the optical functional layer 50 from an upper surface of the optical functional layer 50 toward a lower surface thereof.

In some embodiments, at least one of the display panel 10, the input sensing layer 40, and the optical functional layer 50 may not include a through hole. For example, one or two selected from the group consisting of the display panel 10, the input sensing layer 40, and the optical functional layer 50 may not include a through hole. Alternatively, if the transmittance of the transmission area TA can be secured, each of the display panel 10, the input sensing layer 40, and the optical functional layer 50 may not include a through hole located in the transmission area TA as illustrated in FIG. 2B. In this case, the first non-display area NDA1 around the transmission area TA may be omitted. In other words, the transmission area TA may be surrounded by the display area DA, and the first non-display area NDA1 between the transmission area TA and the display area DA may not be present.

Figure 3:
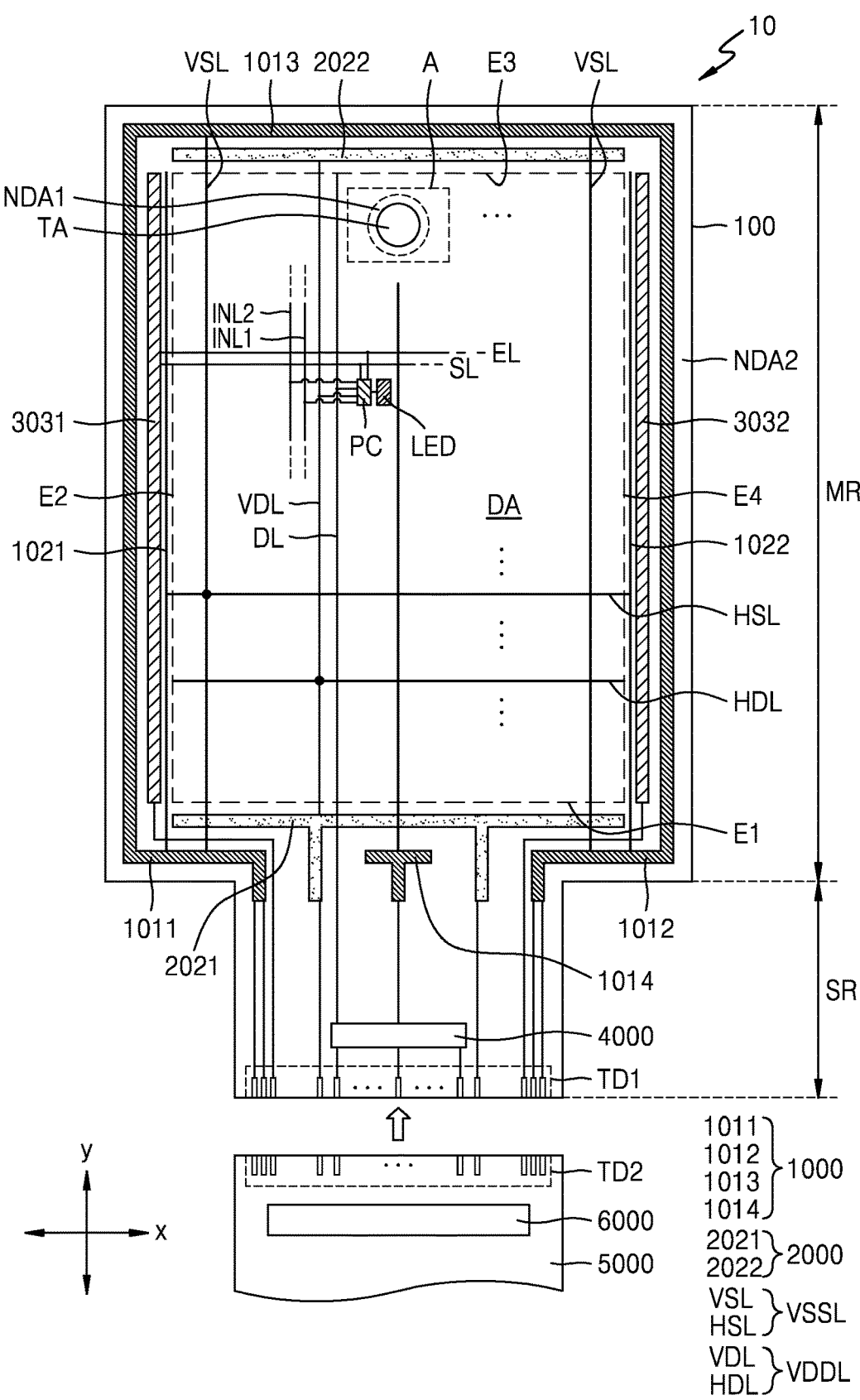
FIG. 3 is a plan view schematically illustrating a display panel according to an embodiment.
Figure 4:
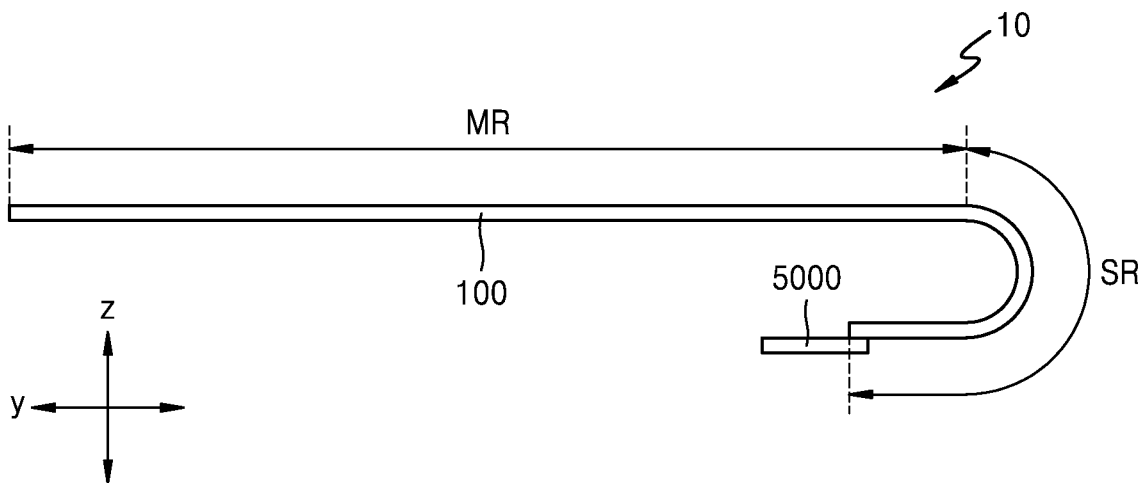
FIG. 4 is a side view schematically illustrating a display panel of FIG. 3.

FIG. 3 is a plan view schematically illustrating a display panel according to an embodiment, and FIG. 4 is a side view schematically illustrating the display panel of FIG. 3.

Referring to FIG. 3, a display panel 10 may include a transmission area TA, a display area DA, a first non-display area NDA1, and a second non-display area NDA2. The shape of the display panel 10 may be substantially the same as the shape of the substrate 100.

The transmission area TA may be inside the display area DA and may be entirely surrounded by the display area DA. The transmission area TA may be at the center of an upper side of the display area DA as illustrated in FIG. 3. In another embodiment, the transmission area TA may be at various positions such as at the upper left side or the upper right side of the display area DA.

The first non-display area NDA1 may be between the transmission area TA and the display area DA and may entirely surround the transmission area TA. As described above with reference to FIG. 2A, when the display panel 10 includes the first through hole (see 10H of FIG. 2A) located in the transmission area TA, a structure for preventing moisture that may be introduced through the first through hole 10H from flowing into the display area DA, may be disposed. For example, layers (e.g., a first functional layer and a second functional layer to be described later) formed of an organic material may be continuously formed in the display area DA to entirely cover the display area DA, but may be discontinuously formed in the first non-display area NDA1. For example, the layers (e.g., the first and second functional layers to be described below) formed of an organic material may include a plurality of parts arranged in the first non-display area NDA1 and separated from each other.

A partial layer (e.g., a second electrode (e.g., a cathode) to be described below) of the display panel 10 may be continuously formed in the display area DA to entirely cover the display area DA, but a portion corresponding to the transmission area TA may be removed to increase transmittance of the transmission area TA. In some embodiments, as described above with reference to FIG. 2B, when the display panel 10 does not include the first through hole 10H, one (e.g., the second electrode (e.g., the cathode) to be described below) of a plurality of layers included in the display panel 10 may include an opening (or through hole) located in the transmission area TA, and thus transmittance may be increased.

The display area DA may be a portion in which an image is displayed, and the display area DA may have various shapes such as a circular shape, an elliptical shape, a polygonal shape, a certain figure shape, and the like. In FIG. 1, the display area DA has an approximately rectangular shape. However, in another embodiment, the display area DA may have an approximately rectangular shape with rounded edges.

Light emitting diodes (LEDs) may be arranged in the display area DA. The LEDs may be electrically connected to sub-pixel circuits PC arranged in the display area DA. The sub-pixel circuit PC may include transistors connected to a signal line or voltage line for controlling on/off and brightness of the LEDs. In this regard, FIG. 3 illustrates a scan line SL, an emission control line EL, a data line DL as signal lines electrically connected to transistors, and illustrates a driving voltage line VDDL, a common voltage line VSSL, a first initialization voltage line INL1, and a second initialization voltage line INL2 as voltage lines.

The second non-display area NDA2 may be outside the display area DA. The second non-display area NDA2 may entirely surround the display area DA. A portion (hereinafter, referred to as a protruding peripheral area) of the second non-display area NDA2 may extend in a direction far away from the display area DA. In other words, the display panel 10 may include a main region MR including the transmission area TA, the first non-display area NDA1, the display area DA, and a portion of the second non-display area NDA2 for surrounding the display area DA, and a sub region SR extending from the main region MR in one direction, and the sub region SR may correspond to the above-described protruding peripheral area. The width (width in x direction) of the sub region SR may be less than the width (width in x direction) of the main region MR, and a portion of the sub region SR may be bent as shown in FIG. 4. When the display panel 10 is bent as shown in FIG. 4, and when the electronic apparatus (1 of FIG. 1A et.) including the display panel 10 is viewed, the second non-display area NDA2 that is a non-display area may be not visible or, even if the second non-display area NDA2 is visible, the visible area may be minimized.

The shape of the display panel 10 may be substantially the same as the shape of the substrate 100. For example, the substrate 100 may include the transmission area TA, the first non-display area NDA1, the display area DA, and the second non-display area NDA2. Alternatively, the substrate 100 may include the main region MR and the sub region SR.

As shown in FIG. 3, a common voltage supply line 1000, a driving voltage supply line 2000, a first driving circuit 3031, a second driving circuit 3032, and a data driving circuit 4000 may be disposed in the second non-display area NDA2.

The common voltage supply line 1000 may include a first common voltage input unit 1011, a second common voltage input unit 1012, and a third common voltage input unit 1014, which are arranged adjacent to a first edge E1 of the display area DA. In an embodiment, the first common voltage input unit 1011 and the second common voltage input unit 1012 may be adjacent to the first edge E1 of the display area DA and may be spaced apart from each other. The third common voltage input unit 1014 may be adjacent to the first edge E1 of the display area DA and may be disposed between the first common voltage input unit 1011 and the second common voltage input unit 1012.

The common voltage input unit 1011 and the second common voltage input unit 1012 may be connected to each other by a body portion 1013 that extend along the second edge E2, the third edge E3, and the fourth edge E4 of the display area DA. In other words, the first common voltage input portion 1011, the second common voltage input portion 1012, and the body portion 1013 may be integrally formed with each other. Alternatively, the common voltage supply line 1000 may have a loop shape of which one side is open, and both ends of the common voltage supply line 1000 may correspond to the first common voltage input unit 1011 and the second common voltage input portion 1012, respectively, and a space between the first common voltage input portion 1011 and the second common voltage input portion 1012 may correspond to the body portion 1013.

A first auxiliary common voltage supply line 1021 and a second auxiliary common voltage supply line 1022 may be disposed in the second non-display area NDA2. Each of the first auxiliary common voltage supply line 1021 and the second auxiliary common voltage supply line 1022 may be a kind of branch extending from the common voltage supply line 1000.

The first auxiliary common voltage supply line 1021 may be electrically connected to the common voltage supply line 1000 and may extend along the second edge E2 of the display area DA. The first auxiliary common voltage supply line 1021 may be disposed between the first driving circuit 3031 to be described below and the second edge E2 of the display area DA.

The second auxiliary common voltage supply line 1022 may be electrically connected to the common voltage supply line 1000 and may extend along the fourth edge E4 of the display area DA. The second auxiliary common voltage supply line 1022 may be disposed between the second driving circuit 3032 to be described below and the fourth edge E4 of the display area DA. The common voltage supply line 1000, the first auxiliary common voltage supply line 1021, and the second auxiliary common voltage supply line 1022 may be electrically connected to common voltage lines VSSL that pass through the display area DA. The common voltage lines VSSLs disposed in the display area DA may extend to cross each other. For example, the common voltage lines VSSL may include common voltage lines (VSL) extending in the y direction and common voltage lines (HSL) extending in the x direction. Hereinafter, for convenience, a 'common voltage line extending in the y direction' is referred to as a vertical common voltage line VSL, and a 'common voltage line extending in the x direction' is referred to as a horizontal common voltage line HSL.

The vertical common voltage line VSL and the horizontal common voltage line HSL may pass through the display area DA to cross each other. The vertical common voltage line VSL and the horizontal common voltage line HSL may be disposed in different layers.

The vertical common voltage line VSL may be electrically connected to the common voltage supply line 1000.

One end of each of the vertical common voltage lines VSL may be connected to the body portion 1013, and the other end of each of the vertical common voltage lines VSL may be connected to the first common voltage input portion 1011, the second common voltage input portion 1012, or the third common voltage input portion 1014.

The horizontal common voltage line HSL may be electrically connected to the first auxiliary common voltage supply line 1021 and the second auxiliary common voltage supply line 1022. One end of each of the horizontal common voltage lines HSL may be connected to the first auxiliary common voltage supply line 1021, and the other end of each of the horizontal common voltage lines HSL may be connected to the second auxiliary common voltage line 1022.

In some embodiments, the vertical common voltage line VSL and the horizontal common voltage line HSL may be electrically connected to each other via a contact hole in at least one insulating layer interposed therebetween. The contact hole for connecting the vertical common voltage line VSL and the horizontal common voltage line HSL may be located in the display area DA. For example, a contact hole for connecting the vertical common voltage line VSL and the horizontal common voltage line HSL may be arranged on a partial region of the display area DA positioned between the first edge E1 and the transmission area TA of the display area DA. In another embodiment, the vertical common voltage line VSL and the horizontal common voltage line HSL in the display area DA may not be in contact with each other in the display area DA.

The driving voltage supply line 2000 may include a first driving voltage input portion 2021 and a second driving voltage input portion 2022, which are spaced apart from each other with the display area DA therebetween. The first driving voltage input portion 2021 and the second driving voltage input portion 2022 may extend substantially parallel to each other with the display area DA therebetween. The first driving voltage input portion 2021 may be disposed adjacent to the first edge E1 of the display area DA, and the second driving voltage input portion 2022 may be disposed adjacent to the third edge E3 of the display area DA.

The driving voltage supply line 2000 may be electrically connected to the driving voltage lines VDDL that pass through the display area DA. The driving voltage lines VSSLs disposed in the display area DA may extend to cross each other. For example, the driving voltage lines VDDL may include driving voltage lines extending in the y direction and driving voltage lines extending in the x direction. Hereinafter, for convenience, a 'driving voltage line extending in the y direction' is referred to as a vertical driving voltage line VDL, and a 'driving voltage line extending in the x direction' is referred to as a horizontal driving voltage line HDL.

The vertical driving voltage line VDL and the horizontal driving voltage line HDL may pass through the display area DA to cross each other. The vertical driving voltage line VDL and the horizontal driving voltage line HDL may be disposed on different layers, and may be connected to each other through a contact hole formed in at least one insulating layer disposed therebetween. The contact hole for connecting the vertical driving voltage line VDL and the horizontal driving voltage line HDL may be located in the display area DA.

A first driving circuit 3031 and a second driving circuit 3032 may be disposed in the second non-display area NDA2 and may be electrically connected to the scan line SL and the emission control line EL. In an embodiment, some scan lines (e.g., scan lines arranged on the left of the transmission area TA) of the scan lines SL may be electrically connected to the first driving circuit 3031, and the other scan lines (e.g., scan lines arranged on the right of the transmission area TA) may be connected to the second driving circuit 3032. The first driving circuit 3031 and the second driving circuit 3032 may include a scan driving portion for generating a scan signal, and the generated scan signal may be transmitted to one transistor of the sub-pixel circuit PC through the scan line SL. The first driving circuit 3031 and the second driving circuit 3032 may include an emission control driving portion for generating an emission control signal, and the generated emission control signal may be transmitted to one transistor of the sub-pixel circuit PC through the emission control line EL.

The data driving circuit 4000 may transmit a data signal to one transistor of the sub-pixel circuit PC through the data line DL passing through the display area DA.

A first terminal portion TD1 may be located at one side of the substrate 100. A printed circuit board 5000 may be attached to the first terminal portion TD1. The printed circuit board 5000 may include a second terminal portion TD2 electrically connected to the first terminal portion TD1, and a controller 6000 may be disposed on the printed circuit board 5000. Control signals of the controller 6000 may be provided to the first and second driving circuits 3031 and 3032, a data driving circuit 4000, a driving voltage supply line 2000, and a common voltage supply line 1000 through the first and second terminal portions TD1 and TD2.

Figure 5:
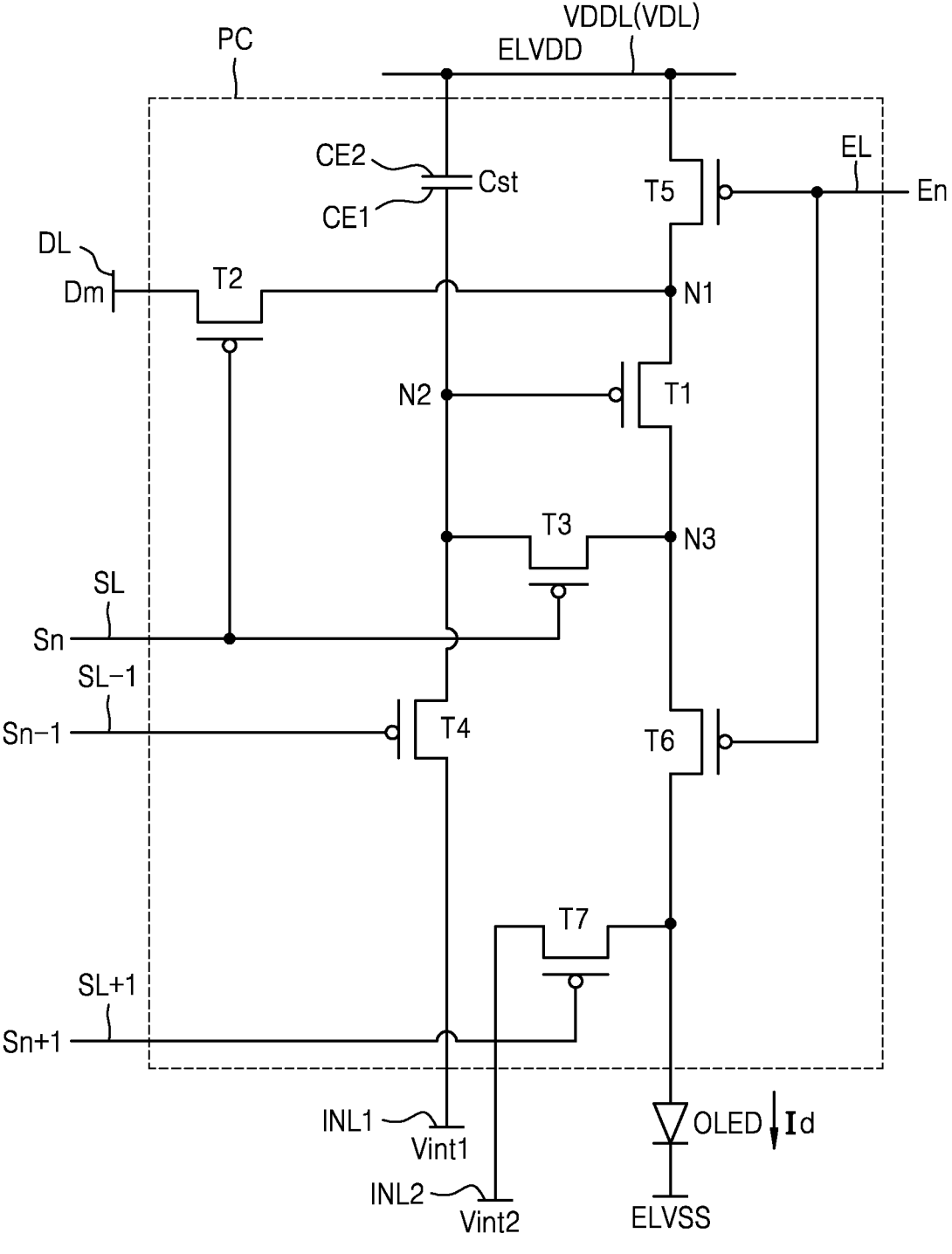
FIG. 5 is an equivalent circuit diagram schematically illustrating a sub-pixel circuit electrically connected to a light emitting diode disposed in the display panel according to an embodiment.

FIG. 5 is an equivalent circuit diagram schematically illustrating a sub-pixel circuit electrically connected to a light emitting diode disposed in the display panel according to an embodiment.

The sub-pixel circuit PC may include a plurality of thin film transistors T1 to T7 and a storage capacitor Cst, as shown in FIG. 5. The sub-pixel circuit PC may be electrically connected to a light emitting diode. Hereinafter, for convenience of explanation, the light emitting diode is an organic light emitting diode OLED.

The plurality of thin film transistors T1 to T7 may include a driving transistor T1, a switching transistor T2, a common transistor T3, a first initialization transistor T4, an operation control transistor T5, an emission control transistor T6, and a second initialization transistor T7.

The light emitting diode, for example, the organic light emitting diode OLED may include a first electrode (e.g., anode) and a second electrode (e.g., cathode), and the first electrode of the organic light emitting diode OLED may be connected to the driving transistor T1 via the emission control transistor T6 to receive a driving current Id, and the second electrode of the organic light emitting diode OLED may receive a common voltage ELVSS. The organic light emitting diode OLED may generate light having brightness corresponding to the driving current Id.

The plurality of thin film transistors T1 to T7 may be p-channel metal oxide semiconductor field effect transistors (MOSFETs)(PMOSs). In another embodiment, some of the plurality of thin film transistors T1 to T7 may be n-channel MOSFETs (NMOSs), and the others thereof may be PMOSs. For example, a compensation transistor T3 and a first initialization transistor T4 of the plurality of thin film transistors T1 to T7 may be NMOSs, and the others thereof may be PMOSs. The compensation transistor T3 of the plurality of thin film transistors T1 to T7 may be an NMOS, and the others thereof may be PMOSs. Alternatively, all of the plurality of thin film transistors T1 to T7 may be NMOSs. The plurality of thin film transistors T1 to T7 may include amorphous silicon or polysilicon. If necessary, the thin film transistor, which is an NMOS, may include an oxide semiconductor.

The sub-pixel circuit PC may be electrically connected to the scan line SL for transmitting the scan signal SN, a previous scan line SL−1 for transferring a previous scan signal Sn−1 to the first initialization transistor T4, and a subsequent scan line SL+1 for transmitting a subsequent scan signal Sn+1 to the second initialization transistor T7.

The sub-pixel circuit PC may be electrically connected to the emission control line EL for transmitting the emission control signal En to the operation control transistor T5 and the emission control transistor T6, and the data line DL for transmitting the data signal Dm.

A driving voltage line VDDL, for example, a vertical driving voltage line VDL, may transmit a driving voltage ELVDD to the driving transistor T1, the first initialization voltage line INL1 may transmit a first initialization voltage Vint1 for initializing the driving transistor T1, and the second initialization voltage line INL2 may transmit a second initialization voltage Vint2 for initializing the first electrode of the organic light emitting diode OLED.

A driving gate electrode of the driving transistor T1 may be connected to the storage capacitor Cst through a second node N2, and one of the source electrode (or source region) and the drain electrode (or the drain region) of the driving transistor T1 may be connected to the vertical driving voltage line VDL via the operation control transistor T5 through the first node N1, and the other of the source electrode (or source region) and the drain electrode (or drain region) of the driving transistor T1 may be electrically connected to the first electrode (e.g., anode) of the organic light emitting diode OLED via the emission control transistor T6 through the third node N3. The driving transistor T1 may receive the data signal Dm according to the switching operation of the switching transistor T2 and may supply a driving current to the organic light emitting diode OLED. That is, the driving transistor T1 may control the amount of current flowing from the first node N1 electrically connected to the vertical driving voltage line VDL to the organic light emitting diode OLED in response to the voltage applied to the second node N2 changed by the data signal Dm.

A switching gate electrode of the switching transistor T2 may be connected to the scan line SL for transmitting the scan signal Sn, and one of the source electrode (or source region) and the drain electrode (or drain region) of the switching transistor T2 may be connected to the data line DL, and the other one of the source electrode (or source region) and the drain electrode (or drain region) of the switching transistor T2 may be connected to the driving transistor T1 through the first node N1 and may be connected to the vertical driving voltage line VDL via the operation control transistor T5. The switching transistor T2 may transmit the data signal Dm from the data line DL to the first node N1 in response to the voltage applied to the scan line SL. That is, the switching transistor T2 may be turned on in response to the scan signal Sn transmitted through the scan line SL and may perform a switching operation for transmitting the data signal Dm transmitted to the data line DL to the driving transistor T1 through the first node N1.

A compensation gate electrode of the compensation transistor T3 may be connected to the scan line SL. One of the source electrode (source region) and the drain electrode (or drain region) of the compensation transistor T3 may be connected to the first electrode of the organic light emitting diode OLED via the emission control transistor T6 through the third node N3. The other one of the source electrode (or source region) and the drain electrode (or drain region) of the compensation transistor T3 may be connected to a first capacitor electrode CE1 of the storage capacitor Cst and the driving gate electrode of the driving transistor T1 through the second node N2. The compensation transistor T3 may be turned on in response to the second scan signal Sn′ transmitted through the scan line SL and may diode-connect the driving transistor T1.

A first initialization gate electrode of the first initialization transistor T4 may be connected to the previous scan line SL−1. One of the source electrode (or source region) and the drain electrode (or drain region) of the first initialization transistor T4 may be connected to the first initialization voltage line INL1. The other one of the source electrode (or source region) and the drain electrode (or drain region) of the first initialization transistor T4 may be connected to the first capacitor electrode CE1 of the storage capacitor Cst and the driving gate electrode of the driving transistor T1 through the second node N2. The first initialization transistor T4 may apply the first initialization voltage Vint1 from the first initialization voltage line INL1 to the second node N2 in response to the voltage applied to the previous scan line SL−1. That is, the first initialization transistor T4 may be turned on in response to the previous scan signal Sn−1 transmitted through the previous scan line SL−1 and may perform an initialization operation of initializing a voltage of the driving gate electrode of the driving transistor T1 by transmitting the first initialization voltage Vint1 to the driving gate electrode of the driving transistor T1.

An operation control gate electrode of the operation control transistor T5 may be connected to the emission control line EL, and the other one of the source electrode (or source region) and the drain electrode (or drain region) of the operation control transistor T5 may be connected to the vertical driving voltage line VDL, and the other one of the source electrode (or source region) and the drain electrode (or drain region) of the operation control transistor T5 may be connected to the driving transistor T1 and the switching transistor T2 through the first node N1.

An emission control gate electrode of the emission control transistor T6 may be connected to the emission control line EL, and one of the source electrode (or source region) and the drain electrode (or drain region) of the emission control transistor T6 may be connected to the driving transistor T1 and the compensation transistor T3 through the third node N3, and the other one of the source electrode (or source region) and the drain electrode (or drain region) of the emission control transistor T6 may be electrically connected to a first node (e.g., anode) of the organic light emitting diode OLED.

The operation control transistor T5 and the emission control transistor T6 may be simultaneously turned on in response to the emission control signal En transmitted through the emission control line EL so that the driving voltage ELVDD may be transmitted to the organic light emitting diode OLED and a driving current may flow through the organic light emitting diode OLED.

A second initialization gate electrode of the second initialization transistor T7 may be connected to the subsequent scan line SL+1, and one of the source electrode (or source region) and the drain electrode (or drain region) of the second initialization transistor T7 may be connected to the first node (e.g., anode) of the organic light emitting diode OLED, and the other one of the source electrode (or source region) and the drain electrode (or drain region) of the second initialization transistor T7 may be connected to the second initialization voltage line INL2 and may receive the second initialization voltage Vint2. The second initialization transistor T7 may be turned on in response to the subsequent scan signal Sn+1 transmitted through the subsequent scan line SL+1 and may initialize the first electrode (e.g., anode) of the organic light emitting diode OLED.

FIG. 5 illustrates that the first initialization transistor T4 and the second initialization transistor T7 is connected to the previous scan line SL−1 and the subsequent scan line SL+1, respectively, and embodiments are not limited thereto. In another embodiment, all of the first initialization transistor T4 and the second initialization transistor T7 may be connected to the previous scan line SL−1 and may be driven in response to the previous scan signal Sn−1.

The storage capacitor Cst may include a first capacitor electrode CE1 and a second capacitor electrode CE2. The first capacitor electrode CE1 of the storage capacitor Cst may be connected to the driving gate electrode of the driving transistor T1 through the second node N2, and the second capacitor electrode CE2 of the storage capacitor Cst may be connected to the vertical driving voltage line VDL. A charge corresponding to a difference between the driving voltage ELVDD and the driving gate electrode voltage of the driving transistor T1 may be stored in the storage capacitor Cst.

Figure 6A:
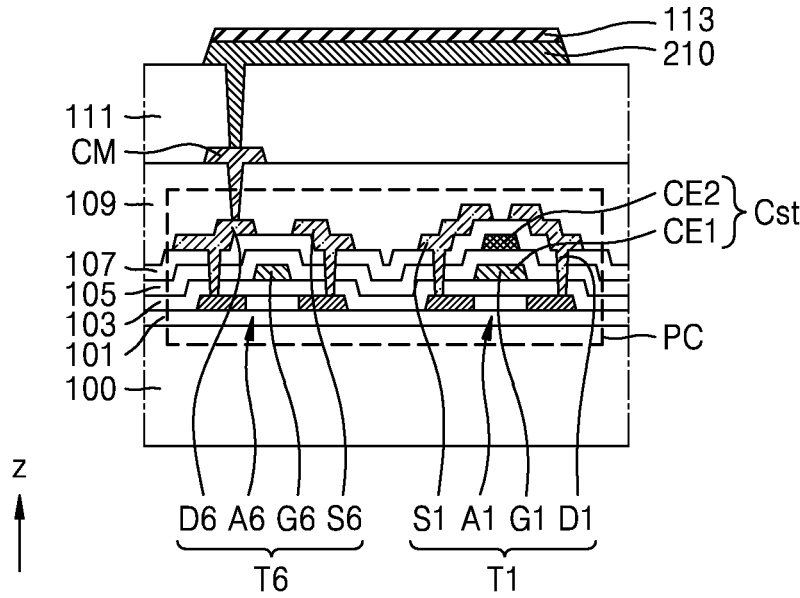
FIGS. 6A through 6J are cross-sectional views schematically illustrating a state according to a manufacturing process of the display panel according to an embodiment.
Figure 6B:
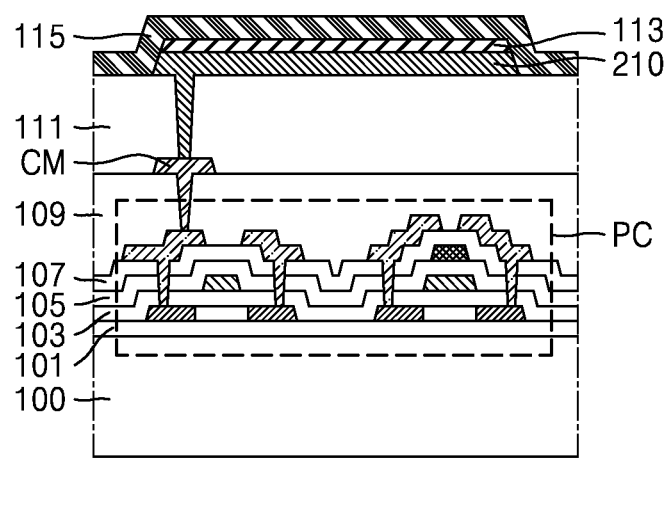
Figure 6C:
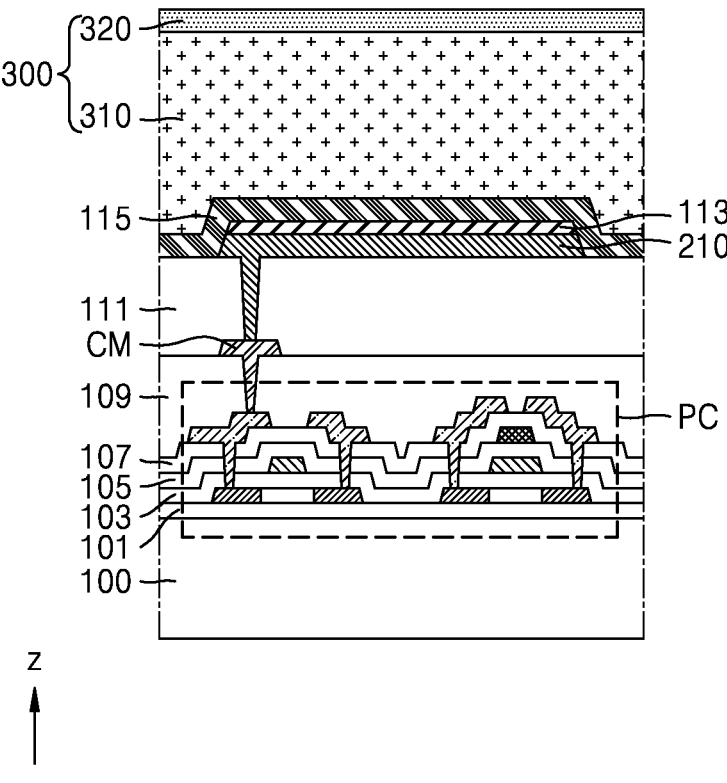
Figure 6D:
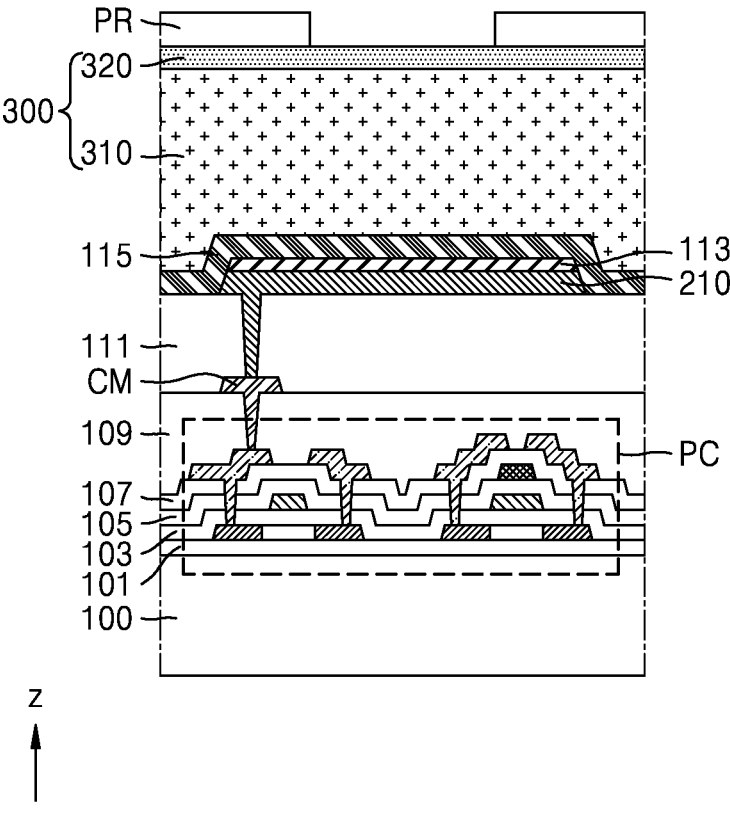
Figure 6E:
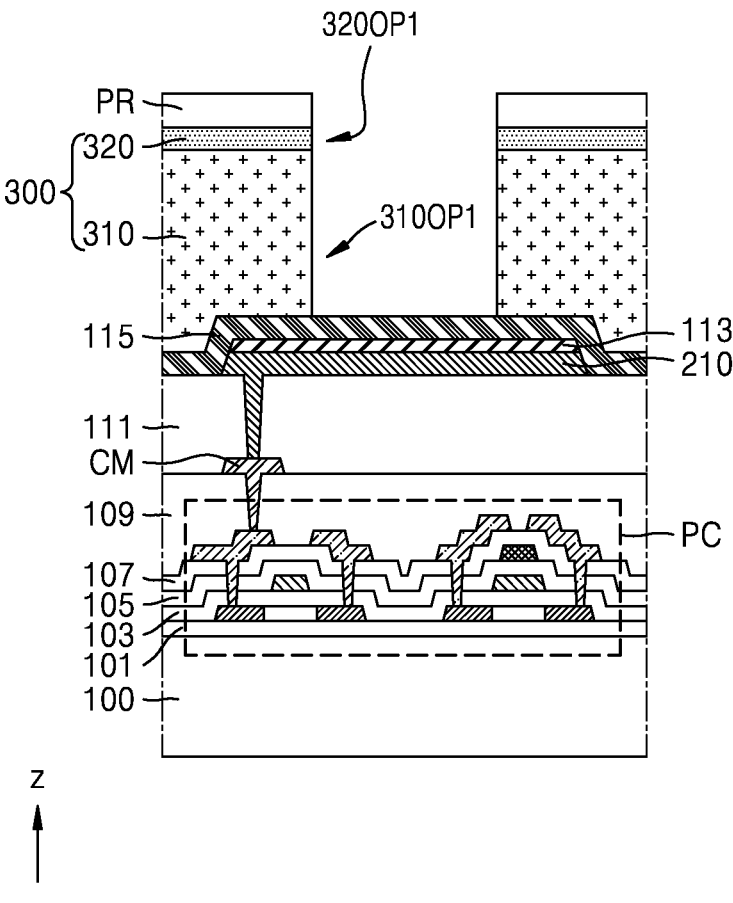
Figure 6F:
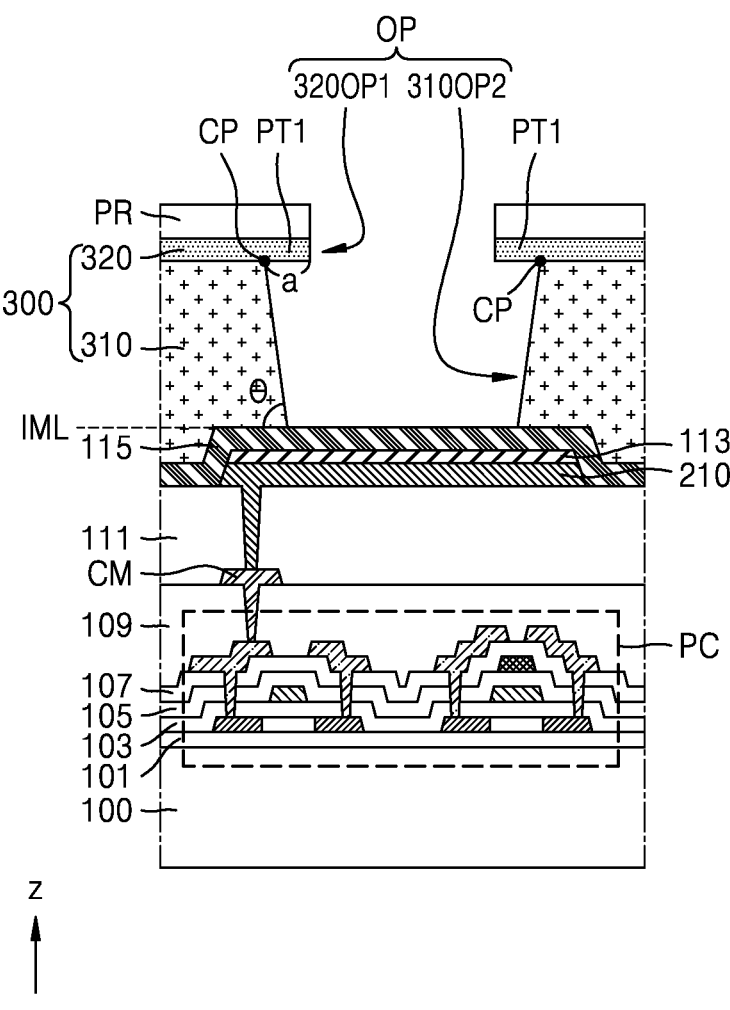
Figure 6G:
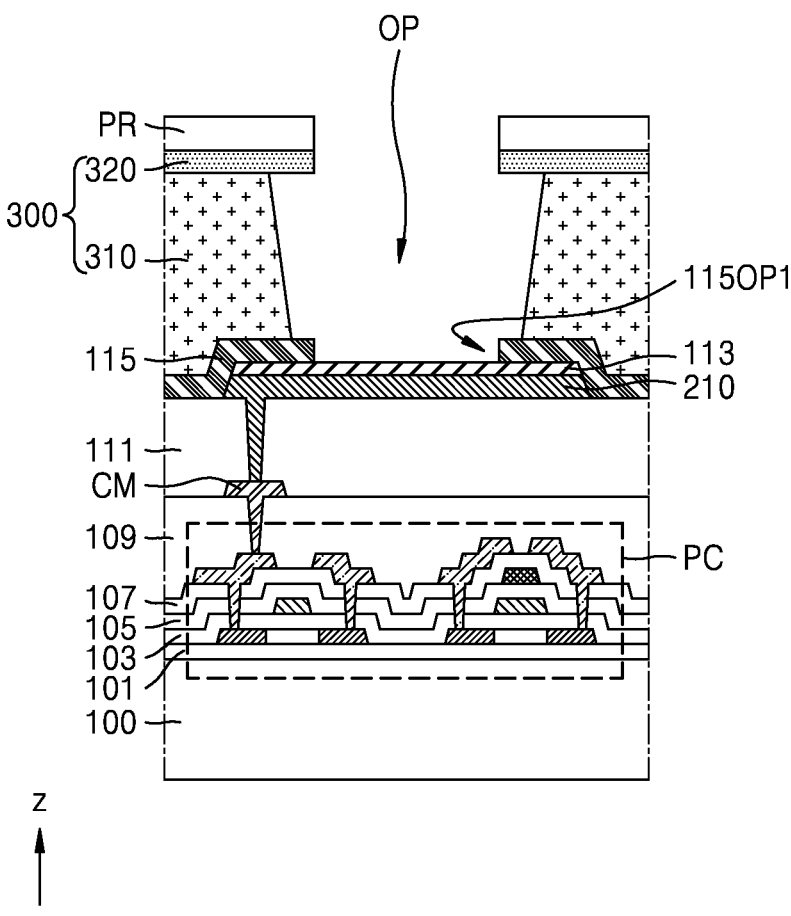
Figure 6H:
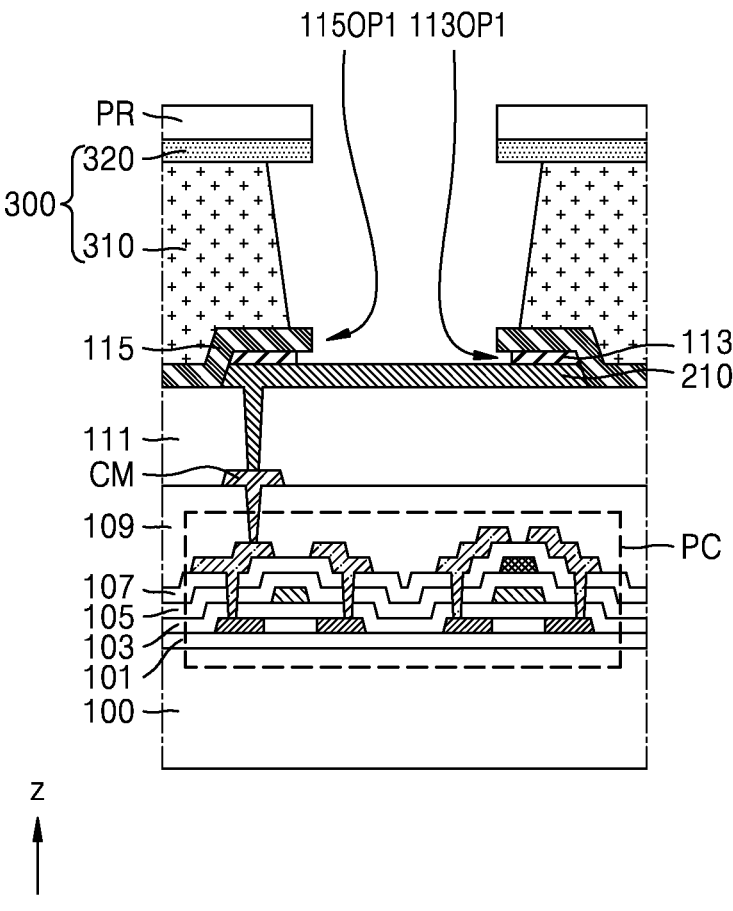
Figure 6I:
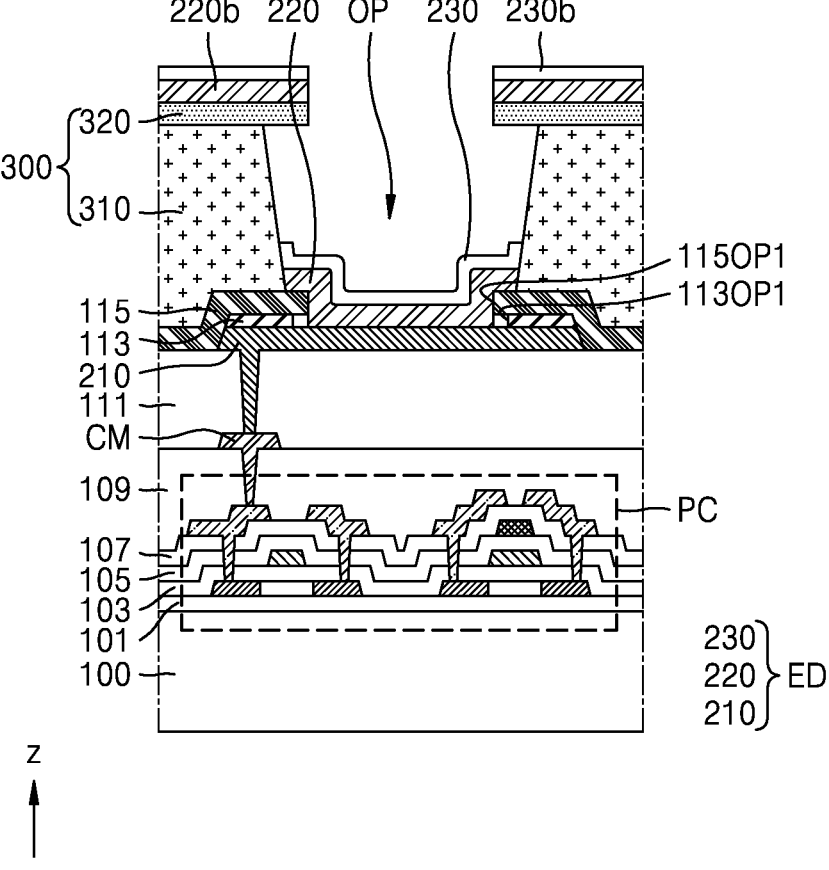
Figure 6J:
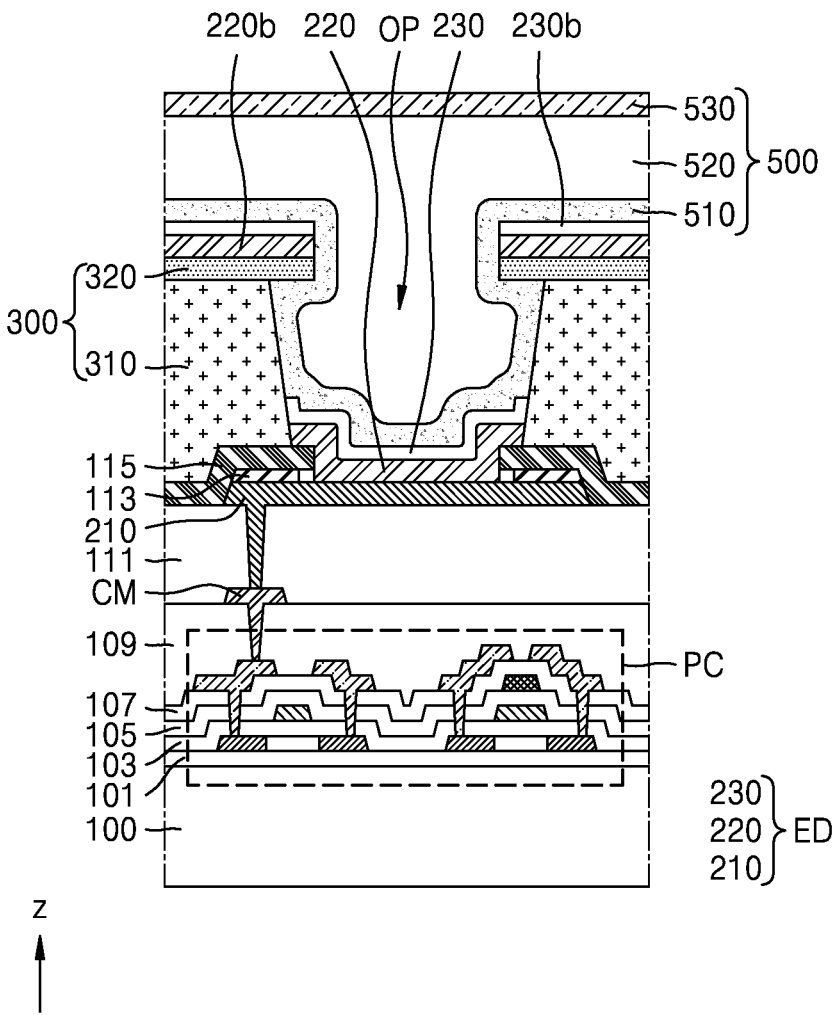
Figure 6K:
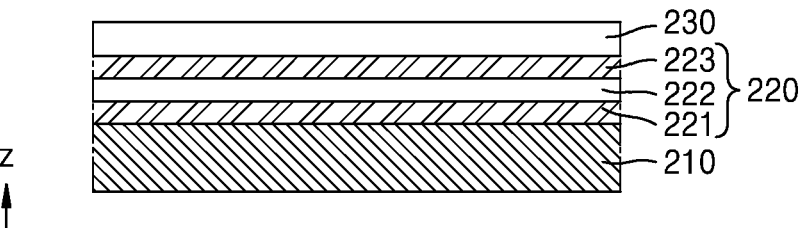
FIG. 6K is a cross-sectional view illustrating a stack structure of a light emitting diode according to an embodiment.

FIGS. 6A through 6J are cross-sectional views schematically illustrating a state according to a manufacturing process of a display panel according to an embodiment, and FIG. 6K is a cross-sectional view illustrating a stack structure of a light emitting diode according to an embodiment.

Referring to FIG. 6A, a sub-pixel circuit PC may be formed on a substrate 100. The substrate 100 may include glass or a polymer resin. The substrate 100 may include a structure in which a base layer including the polymer resin and an inorganic barrier layer are stacked. The polymer resin may be polyethersulfone (PES), polyacrylate (PAR), polyether imide (PEI), polyethylene naphthalate (PEN), polyethylene terephthalate (PET), leather), polyphenylene sulfide (PPS), polyarylate, polyimide (PI), polycarbonate, cellulose triacetate (TAC), and cellulose acetate propionate (CAP).

A buffer layer 101 may be disposed on an upper surface of the substrate 100. The buffer layer 101 may be configured to prevent impurities from penetrating into a semiconductor layer of a transistor. The buffer layer 101 may include an inorganic insulating material such as silicon nitride, silicon oxynitride, and silicon oxide, and may have a single layer or multi-layered structure including the above-described inorganic insulating material.

The sub-pixel circuit PC may be arranged on the buffer layer 101. The sub-pixel circuit PC may include a plurality of transistors and a storage capacitor, as described above in FIG. 5. In an embodiment, FIG. 6A illustrates a driving transistor T1, an emission control transistor T6, and a storage capacitor Cst of the sub-pixel circuit PC.

The driving transistor T1 may include a first semiconductor layer A1 on the buffer layer 101 and a first gate electrode G1 that overlaps a channel region of the first semiconductor layer A1. The first semiconductor layer A1 may include a silicon-based semiconductor material, for example, polysilicon. The first semiconductor layer A1 may include a channel region and a first region and a second region at both sides of the channel region. The first region and the second region may be regions including impurities having higher concentration than that of the channel region, and one of the first region and the second region may correspond to a source region, and the other one thereof may correspond to a drain region.

The emission control transistor T6 may include a sixth semiconductor layer A6 on the buffer layer 101 and a sixth gate electrode G6 that overlaps a channel region of the sixth semiconductor layer A6. The sixth semiconductor layer A6 may include a silicon-based semiconductor material, for example, polysilicon. The sixth semiconductor layer A6 may include a channel region and a first region and a second region at both sides of the channel region. The first region and the second region may be regions including impurities having higher concentration than that of the channel region, and one of the first region and the second region may correspond to a source region, and the other one thereof may correspond to a drain region.

The first gate electrode G1 and the sixth gate electrode G6 may include a conductive material including molybdenum (Mo), aluminum (Al), copper (Cu), titanium (Ti), and the like, and may have a single layer or multi-layered structure including the above-described materials. A first gate insulating layer 103 for electrically insulating the first semiconductor layer A1 and the sixth semiconductor layer A6 may be disposed under the first gate electrode G1 and the sixth gate electrode G6. The first gate insulating layer 103 may include an inorganic insulating material such as silicon nitride, silicon oxynitride, and silicon oxide, and may have a single layer or multi-layered structure including the above-described inorganic insulating material.

The storage capacitor Cst may include a first capacitor electrode CE1 and a second capacitor electrode CE2 that overlap each other. In an embodiment, the first capacitor electrode CE1 of the storage capacitor Cst may include a first gate electrode G1. In other words, the first gate electrode G1 may include a first capacitor electrode CE1 of the storage capacitor Cst. For example, the first gate electrode G1 and the first capacitor electrode CE1 of the storage capacitor Cst may be integrally formed with each other.

A first interlayer insulating layer 105 may be disposed between the first capacitor electrode CE1 and the second capacitor electrode CE2 of the storage capacitor Cst. The first interlayer insulating layer 105 may include an inorganic insulating material such as silicon nitride, silicon oxynitride, and silicon oxide, and may have a single layer or multi-layered structure including the above-described inorganic insulating material.

The second capacitor electrode CE2 of the storage capacitor Cst may include a low-resistance conductive material such as Mo, Al, Cu and/or Ti, and may include a single layer or a multi-layered structure formed of the above-described material.

A second interlayer insulating layer 107 may be disposed on the storage capacitor Cst. The second interlayer insulating layer 107 may include an inorganic insulating material such as silicon nitride, silicon oxynitride, and silicon oxide, and may have a single layer or multi-layered structure including the above-described inorganic insulating material.

A source electrode S1 and/or a drain electrode D1 electrically connected to the first semiconductor layer A1 of the driving transistor T1 may be disposed on the second interlayer insulating layer 107. A source electrode S6 and/or a drain electrode D6 electrically connected to the sixth semiconductor layer A6 of the emission control transistor T6 may be disposed on the second interlayer insulating layer 107. The source electrodes S1 and S6 and/or the drain electrodes D1 and D6 may include Al, Cu and/or Ti, and may have a single layer or multi-layered structure including the above-described materials.

A first organic insulating layer 109 may be disposed on the sub-pixel circuit PC. The first organic insulating layer

109 may include an organic insulating material such as acryl, benzocyclobutene (BCB), polyimide or hexamethyldisiloxane (HMDSO).

A connection metal CM may be disposed on the first organic insulating layer 109. The connection metal CM may include Al, Cu and/or T, and may have a single layer or multi-layered structure including the above-described materials.

The second organic insulating layer 111 may be disposed between the connection metal CM and a sub-pixel electrode 210. The second organic insulating layer 111 may include an organic insulating material such as acryl, BCB, polyimide or HMDSO. According to an embodiment described by referring to FIG. 3A, the sub-pixel circuit PC and the sub-pixel electrode 210 may be electrically connected to each other via the connection metal CM. However, according to another embodiment, the connection metal CM may be omitted, and one organic insulating layer may be disposed between the sub-pixel circuit PC and the sub-pixel electrode 210. Alternatively, three or more organic insulating layers may be disposed between the sub-pixel circuit PC and the sub-pixel electrode 210, and the sub-pixel circuit PC and the sub-pixel electrode 210 may be electrically connected to each other via a plurality of connection metals.

The sub-pixel electrode 210 may be formed on the second organic insulating layer 111. The sub-pixel electrode 210 may also be formed to be a (semi-)transparent electrode or a reflective electrode. When the sub-pixel electrode 210 is formed as a (semi-)transparent electrode, the sub-pixel electrode 210 may be formed of indium tin oxide (ITO), indium zinc oxide (IZO), zinc oxide (ZnO), indium oxide ($In_2O_3$), indium gallium oxide (IGO) or aluminum zinc oxide (AZO). When the sub-pixel electrode 210 is formed as a reflective electrode, a reflective layer is formed of silver (Ag), magnesium (Mg), Al, platinum (Pt), palladium (Pd), gold (Au), nickel (Ni), neodymium (Nd), iridium (Ir), chromium (Cr) or a compound thereof, and a layer formed of ITO, IZO, ZnO or $In_2O_3$ may be formed on the reflective layer. In an embodiment, the sub-pixel electrode 210 may have a structure in which an ITO layer, an Ag layer and an ITO layer are sequentially stacked. The sub-pixel electrode 210 may be electrically connected to the connection metal CM through a contact hole in the second organic insulating layer 111.

A protection layer 113 may be formed on the sub-pixel electrode 210. The protection layer 113 may be formed together with the sub-pixel electrode 210. For example, the sub-pixel electrode 210 and the protection layer 113 may be formed using the same mask. The protection layer 113 may be configured to prevent the sub-pixel electrode 210 from being damaged by a gaseous or liquid material used in various etching processes or ashing processes included in the manufacturing process of the display panel. The protection layer 113 may include a conductive oxide such as indium tin oxide (ITO), indium zinc oxide (IZO), indium gallium zinc oxide (IGZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO).

Referring to FIG. 6B, an insulating layer 115 may be formed on the structure shown in FIG. 6A. The insulating layer 115 may be entirely formed on the substrate 100. For example, the insulating layer 115 may overlap the sub-pixel electrode 210 and the protection layer 113 and may be in direct contact with an upper surface of the second organic insulating layer 111 on which the sub-pixel electrode 210 and the protection layer 113 are not present. The insulating layer 115 may be configured to cover side surfaces of each of the sub-pixel electrode 210 and the protection layer 113. The insulating layer 115 may include an inorganic insulating material. When the insulating layer 115 includes an inorganic insulating material, the quality of the light emitting diode may be prevented from being deteriorated or minimized by gas discharged from the insulating layer, which is an organic insulating material, during the manufacturing process of the display panel, compared to the case where the insulating layer 115 includes an organic insulating material.

The insulating layer 115 may include an inorganic insulating material such as silicon nitride, silicon oxynitride, and silicon oxide, and may have a single layer or multi-layered structure including the above-described inorganic insulating material. In an embodiment, the insulating layer 115 may have a two-layer structure of a silicon oxide layer and a silicon nitride layer. The thickness of the silicon oxide layer may be less than the thickness of the silicon nitride layer. In some embodiments, the thickness of the insulating layer 115 may be less than the thickness of the protection layer 113. For example, the thickness of the insulating layer 115 may be about 1000 Å, and the thickness of the protection layer 113 may be about 500 Å. However, embodiments are not limited thereto.

Referring to FIG. 6C, a metal bank layer 300 may be formed on the insulating layer 115 shown in FIG. 6B. The metal bank layer 300 may include a first metal layer 310 and a second metal layer 320 on the first metal layer 310.

The first metal layer 310 and the second metal layer 320 may have different compositions. For example, the first metal layer 310 and the second metal layer 320 may include different metals. For example, the first metal layer 310 and the second metal layer 320 may include metals having different etching selectivity. In an embodiment, the first metal layer 310 may be a layer including Al, and the second metal layer 320 may be a layer including Ti.

The thickness of the first metal layer 310 may be greater than the thickness of the second metal layer 320. In an embodiment, the thickness of the first metal layer 310 may be about 5 times the thickness of the second metal layer 320. In another embodiment, the thickness of the first metal layer 310 may be about 6 times, about 7 times or about 8 times the thickness of the second metal layer 320. In an embodiment, the thickness of the first metal layer 310 may be about 4000 Å to about 8000 Å, and the thickness of the second metal layer 320 may be about 500 Å to about 800 Å. The thickness of the first metal layer 310 may be about 4 times, about 5 times or about 6 times the thickness of the insulating layer 115.

Referring to FIG. 6D, a photoresist PR may be formed on the metal bank layer 300. The photoresist PR may include an opening that overlaps the sub-pixel electrode 210 and the protection layer 113. A portion of an upper surface of the metal bank layer 300 may be exposed through the opening of the photoresist PR.

Referring to FIG. 6E, a portion of the metal bank layer 300, for example, a portion of the second metal layer 320 and a portion of the first metal layer 310, may be removed by using the photoresist PR as a mask. For example, a portion of the second metal layer 320 and a portion of the first metal layer 310 may be sequentially removed through the opening of the photoresist PR. A portion of the second metal layer 320 and a portion of the first metal layer 310 may be removed through dry etching. During an etching process, the insulating layer 115 and the protection layer 113 may protect the sub-pixel electrode 210 thereunder.

By using the etching process, an opening 320OP1 that overlaps the sub-pixel electrode 210 and the protection layer 113 and passes through a bottom surface from an upper surface of the second metal layer 320 may be formed in the second metal layer 320. An opening 310OP1 that overlaps the sub-pixel electrode 210 and the protection layer 113 and passes through a bottom surface from an upper surface of the first metal layer 310 may be formed in the first metal layer 310.

Referring to FIG. 6F, an opening OP having an undercut shape may be formed in the metal bank layer 300 by using the photoresist PR as a mask. The material of the metal bank layer 300 is absent from the opening OP.

For example, a portion of the first metal layer 310 may be further etched using the photoresist PR as a mask, and an opening 310OP2 having a width greater than that of the opening 310OP1 of the first metal layer 310 formed in the process of FIG. 3E described above may be formed in the first metal layer 310. In some embodiments, the opening 310OP2 of the first metal layer 310 may have a shape in which a width thereof decreases toward a lower portion thereof. For example, the width of an upper portion of the opening 310OP2 of the first metal layer 310 may be greater than a width of a lower portion thereof. In other words, the side surface of the first metal layer 310 toward the opening 310OP2 may include a forward tapered inclined surface.

In some embodiments, the opening OP having an undercut shape may be formed in the metal bank layer 300 through wet etching. For example, the opening 310OP2 of the first metal layer 310 may be formed through wet etching. Because the first metal layer 310 and the second metal layer 320 include metals having different etching selectivity, a portion of the first metal layer 310 may be removed in a wet etching process, and an opening 310OP2 of the first metal layer 310 having a width greater than the width of the opening 320OP1 of the second metal layer 320 may be formed. During an etching process of forming the opening 310OP2 of the first metal layer 310, the insulating layer 115 and the protection layer 113 may be configured to protect the sub-pixel electrode 210 thereunder.

Because the opening 310OP2 of the first metal layer 310 has a large diameter while overlapping the opening 320OP1 of the second metal layer 320, the second metal layer 320 may have a first tip PT1.

A portion of the second metal layer 320 that defines the opening 320OP1 of the second metal layer 320 may protrude from a point CP which faces the opening 310OP2 of the first metal layer 310 and in which the side surface of the first metal layer 310 and a bottom surface of the second metal layer 320 meet each other, toward the opening 320OP1 and may have an undercut structure. A portion of the second metal layer 320 that further protrudes toward the opening 320OP1 may correspond to the first tip PT1. A length of the first tip PT1, for example, "a" from the above-described point CP to an edge (or side surface) of the first tip PT1 may be about 2 μm or less. In some embodiments, the length of the first tip PT1 of the second metal layer 320 may be about 0.3 μm to about 1 μm, or about 0.3 μm to about 0.7 μm.

The inclination angle of the side surface of the forward tapered first metal layer 310 facing the opening 310OP2 of the first metal layer 310 (for example, the inclination angle θ of the side surface of the first metal layer 310 with respect to an imaginary line IML parallel to the upper surface of the substrate 100) may be greater than or equal to about 60° and less than about 90°.

Referring to FIG. 6G, a portion of the insulating layer 115 may be removed using the photoresist PR as a mask. A portion of the insulating layer 115 may be removed through dry etching. The width of the opening 115OP of the insulating layer 115 may be substantially the same as the width of an opening region of the photoresist PR and/or the upper width of the opening OP of the metal bank layer 300 (for example, the width of the opening 320OP1 of the second metal layer 320).

For example, the width of the opening 115OP of the insulating layer 115 may be less than the width of a lower portion of the first metal layer 310. A lower portion of the side surface of the first metal layer 310 (for example, a point where the side surface and the bottom surface of the first metal layer 310 meet each other) may contact an upper surface of the insulating layer 115.

Referring to FIG. 6H, a portion of the protection layer 113 may be removed using the photoresist PR as a mask. A portion of the protection layer 113 may be removed using wet etching, and the sub-pixel electrode 210 may be exposed through the opening 113OP of the protection layer 113. A width of the opening 113OP of the protection layer 113 formed by removing a portion of the protection layer 113 may be greater than a width of the opening 115OP of the insulating layer 115. In other words, an edge (or side surface) of the protection layer 113 for defining the opening 113OP of the protection layer 113 may be located under the insulating layer 115.

Subsequently, the photoresist PR may be removed.

Referring to FIG. 6I, the intermediate layer 220 and the opposite electrode 230 may be formed on the structure of FIG. 6H from which the photoresist PR is removed, to overlap the sub-pixel electrode 210. The stack structure of the sub-pixel electrode 210, the intermediate layer 220, and the opposite electrode 230 may correspond to a light emitting diode ED. In some embodiments, the intermediate layer 220 and the opposite electrode 230 may be formed through a deposition method such as a thermal deposition method.

The intermediate layer 220 may include a light emitting layer 222, as shown in FIG. 6K. The intermediate layer 220 may include a common layer interposed between the sub-pixel electrode 210 and the light emitting layer 222 and/or between the light emitting layer 222 and the opposite electrode 230. Hereinafter, a common layer between the sub-pixel electrode 210 and the light emitting layer 222 is referred to as a first common layer 221, and a common layer between the light emitting layer 222 and the opposite electrode 230 is referred to as a second common layer 223.

The light emitting layer 222 may include a polymer or small molecular organic material that emits light of a certain color (red, green or blue). In another embodiment, the light emitting layer 222 may include an inorganic material or quantum dot.

The first common layer 221 may include a hole transport layer (HTL) and/or a hole injection layer (HIL). The second common layer 223 may include an electron transport layer (ETL) and/or an electron injection layer (EIL). The first common layer 221 and the second common layer 223 may include an organic material.

The intermediate layer 220 may have a single stack structure including a single light emitting layer or a tandem structure having a multi-stack structure including a plurality of light emitting layers. When the intermediate layer 220 has a tandem structure, a charge generation layer (CGL) may be disposed between a plurality of stacks.

The opposite electrode 230 may include a conductive material having a low work function. For example, the opposite electrode 230 may include a (semi-)transparent layer including Ag, Mg, Al, Pt, Pd, Au, Ni, Nd, Ir, Cr, Li, Ca or an alloy thereof. Alternatively, the opposite electrode 230 may further include a layer such as ITO, IZO, ZnO or $In_2O_3$ on the (semi-)transparent layer including the above-described materials.

Referring back to FIG. 6I, the intermediate layer 220 may overlap and contact the sub-pixel electrode 210 through the opening OP of the metal bank layer 300, the opening 115OP1 of the insulating layer 115, and the opening 113OP1 of the protection layer 113. The width of the light emitting region of the light emitting diode ED may be substantially the same as the width of the opening 115OP1 of the insulating layer 115.

Because the intermediate layer 220 and the opposite electrode 230 are deposited without an additional mask, a deposition material for forming the intermediate layer 220 and a deposition material for forming the opposite electrode 230 may be used to form a dummy intermediate layer 220b and a dummy opposite electrode 230b on the metal bank layer 300. The intermediate layer 220 and the dummy intermediate layer 220b may be separated and spaced apart from each other, and the opposite electrode 230 and the dummy opposite electrode 230b may be separated and spaced apart from each other. The intermediate layer 220 and the dummy intermediate layer 220b may include the same material and/or the same number of sub-layers (e.g., a first common layer, a light emitting layer, and a second common layer). The opposite electrode 230 and the dummy opposite electrode 230b may include the same material.

An edge or an outer portion (or a peripheral portion) of the opposite electrode 230 may extend beyond an edge or an outer portion (or peripheral portion) of the intermediate layer 220 and may directly contact a side surface of the first metal layer 310. The first metal layer 310 and the opposite electrode 230 may be electrically connected to each other. In the present specification, the outer portion (or the peripheral portion) of the opposite electrode 230 represents a "portion of the opposite electrode 230 including the edge of the opposite electrode 230".

Referring to FIG. 6J, an encapsulation layer 500 may be formed on the light emitting diode ED. The encapsulation layer 500 may include at least one inorganic encapsulation layer and at least one organic encapsulation layer. In an embodiment, FIG. 3J illustrates that the encapsulation layer 500 includes a first inorganic encapsulation layer 510, an organic encapsulation layer 520 on the first inorganic encapsulation layer 510, and a second inorganic encapsulation layer 530 on the organic encapsulation layer 520.

The first inorganic encapsulation layer 510 and the second inorganic encapsulation layer 530 may include at least one inorganic material of aluminum oxide, titanium oxide, tantalum oxide, hafnium oxide, zinc oxide, silicon oxide, silicon nitride, or silicon oxynitride, and may be deposited by a method such as chemical vapor deposition. The first inorganic encapsulation layer 510 and the second inorganic encapsulation layer 530 may have a single layer or multi-layered structure including the above-described materials. The organic encapsulation layer 520 may include a polymer-based material. The polymer-based material may include an acrylic resin, an epoxy-based resin, polyimide, and polyethylene. In an embodiment, the organic encapsulation layer 520 may include acrylate.

The first inorganic encapsulation layer 510 having relatively excellent step coverage may cover at least a portion of the inner surface of the opening OP of the metal bank layer 300 having the undercut structure. In an embodiment, the first inorganic encapsulation layer 510 may be continuously formed to overlap (or cover) an upper surface and a side surface of the dummy opposite electrode 230b, a side surface of the dummy intermediate layer 220b, a side surface and a bottom surface of the second metal layer 320, a side surface of the first metal layer 310, and an upper surface of the opposite electrode 230.

The organic encapsulation layer 520 may be disposed on the first inorganic encapsulation layer 510 and may fill at least a portion of the opening OP of the metal bank layer 300. The second inorganic encapsulation layer 530 may be disposed on the organic encapsulation layer 520.

In the embodiment shown in FIGS. 6A through 6J, the metal bank layer 300 is illustrated as including a first metal layer 310 and a second metal layer 320 on the first metal layer 310, but embodiments are not limited thereto. In another embodiment, the metal bank layer 300 may include a first metal layer 310, a second metal layer 320 on the first metal layer 310, and a third metal layer below the first metal layer 310, wherein the third metal layer may include the same material as the first metal layer or include another material.

Figure 7:
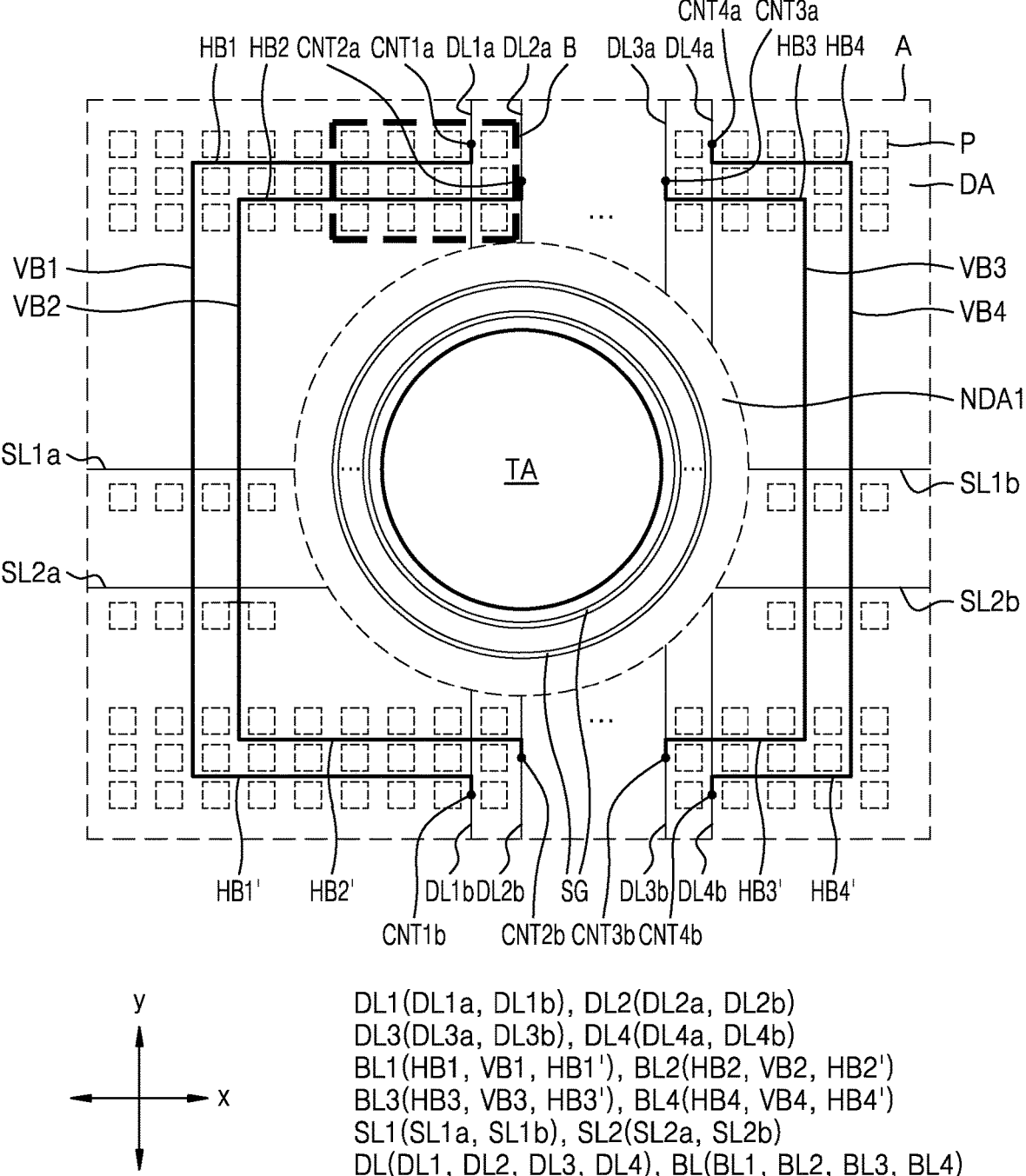
FIG. 7 is a plan view schematically illustrating portions of a transmission area and a display area adjacent to the transmission of the display panel according to an embodiment.

FIG. 7 is a plan view schematically illustrating portions of a transmission area and a display area adjacent to the transmission of the display panel according to an embodiment.

Referring to FIG. 7, sub-pixels P may be disposed in the display area DA. A first non-display area NDA1 may be between the transmission area TA and the display area DA (as shown in, for example, FIG. 1B). The sub-pixels P adjacent to the transmission area TA may be spaced apart from each other with respect to the transmission area TA in a plan view.

In a plan view of FIG. 7, the sub-pixels P may be spaced apart from each other in a vertical direction with respect to the transmission area TA or may be spaced apart from each other on the left and right sides of the transmission area TA. Because each sub-pixel P uses red, green and blue light emitted from the light emitting diode, the position of the sub-pixels P shown in FIG. 7 corresponds to the position of light emitting diodes. Thus, the sub-pixels P being spaced apart from each other with respect to the transmission area TA in a plan view may represent that light emitting diodes are spaced apart from each other with respect to the transmission area TA in a plan view. For example, in a plan view, the light emitting diodes may be spaced apart from each other in a vertical direction with respect to the transmission area TA or may be spaced apart from each other on the left and right sides of the transmission area TA. However, embodiments are not limited thereto, and in some embodiments, a plurality of sub-pixels P may also be disposed in the transmission area TA.

Sub-grooves SG may be located between the first non-display area NDA1, that is, between the display area DA and the transmission area TA. In a plan view, each of the sub-grooves SG may have a closed-loop shape surrounding the transmission area TA, and the sub-grooves SG may be arranged to be spaced apart from each other. In some embodiments, sub-grooves SG may have a structure similar to grooves G described below, or may be grooves formed by removal of the first organic insulating layer and the second organic insulating layer.

Referring to FIG. 7, the upper side and the lower side lines of the transmission area TA may be separated or spaced apart from each other with a transmission area TA therebetween. For example, the first through fourth data lines DL1, DL2, DL3, and DL4 may be disposed on upper and lower sides of the transmission area TA, respectively, and may include separate or spaced portions. However, for convenience of explanation, the data lines DL separated or spaced apart from each other with the transmission area TA therebetween only illustrate first through fourth data lines DL1, DL2, DL3, and DL4. However, embodiments are not limited thereto, and data lines DL arranged adjacent to the transmission area TA may be further included.

The left side and the right side lines of the transmission area TA may be separated or spaced apart from each other with a transmission area TA therebetween. For example, the first and second scan lines SL1 and SL2 may be disposed on left and right sides of the transmission area TA, respectively, and may include separate or spaced portions. However, for convenience of explanation, the scan lines SL separated or spaced apart from each other with the transmission area TA therebetween only illustrate a first scan line SL1 and a second scan line SL2. However, embodiments are not limited thereto, and scan lines SL arranged adjacent to the transmission area TA may be further included.

First, scan lines SL on the left and right sides of the transmission area TA will be described below.

The scan lines SL may extend in a first direction (e.g., x direction), and some scan lines may include spaced portions with the transmission area TA therebetween. In this regard, FIG. 7 illustrate that each of the first scan line SL1 and the second scan line SL2 extends in the first direction (e.g., x direction) and includes first portions SL1a and SL2a of the scan lines and second portions SL1b and SL2b of the scan lines spaced apart from each other with the transmission area TA therebetween. That is, the first portions SL1a and SL2a of the scan lines may be arranged on the left side of the transmission area TA, and the second portions SL1b and SL2b of the scan lines may be arranged on the right side of the transmission area TA. Accordingly, as described above with reference to FIG. 3, the first portions SL1a and SL2a of the scan lines may receive a signal from the first driving circuit (see 3031 of FIG. 3) disposed on the left side of the display area DA, and the second portions SL1b and SL2b of the scan lines may receive a signal from the second driving circuit (see 3032 of FIG. 3) disposed on the right side of the display area DA.

Next, data lines DL on the left and right sides of the transmission area TA will be described below.

The data lines DL may extend in a second direction (e.g., y direction), and some data lines may include spaced portions with the transmission area TA therebetween. In this regard, FIG. 7 illustrates that each of first through fourth data lines DL1, DL2, DL3 and DL4 extends in the second direction (e.g., y direction) and includes first portions DL1a, DL2a, DL3a and DL4a of data lines and second portions DL1b, DL2b, DL3b, and DL4b of data lines spaced apart from each other with the transmission area TA therebetween. That is, the first portions DL1a, DL2a, DL3a, and DL4a of the data lines may be arranged on the upper side of the transmission area TA, and the second portions DL1b, DL2b, DL3b, and DL4b of the data lines may be arranged on the lower side of the transmission area TA.

Unlike that a signal is respectively transmitted from the driving circuit arranged on the left and the right of the first portions SL1a and SL2a of the scan lines and the second portions SL1b and SL2b of the scan lines, the first portions DL1a, DL2a, DL3a, and DL4a of the data lines and the second portions DL1b, DL2b, DL3b, and DL4b of the data lines may receive the same signal from the data driving circuit (see 4000 of FIG. 3) disposed at the lower side.

To this end, bridge lines BL1, BL2, BL3, and BL4 for connecting the first portions DL1a, DL2a, DL3a, and DL4a of the data lines to the second portions DL1b, DL2b, DL3b, and DL4b of the data lines may be arranged. That is, the first portions DL1a, DL2a, DL3a, and DL4a of the data lines and the second portions DL1b, DL2b, DL3b, and DL4b of the date lines spaced apart from each other with the transmission area TA therebetween may be electrically connected to each other through the bridge lines BL1, BL2, BL3, and BL4 located in the display area DA. For example, the first portion DL1a of the first data line DL1 and the second portion DL1b of the first data line DL1 may be electrically connected to each other through a first bridge line BL1.

Specifically, the first bridge line BL1 may include a first vertical bridge line VB1 extending along the second direction (e.g., the y direction) and a pair of first horizontal bridge lines HB1 and HB1' disposed at both ends of the first vertical bridge line VB1, respectively, and extending in the first direction (e.g., the x direction). That is, because the first bridge line BL1 includes a first vertical bridge line VB1 and a pair of first horizontal bridge lines HB1 and HB1', the first portion DL1a of the first data line DL1 and the second portion DL1b of the first data line DL1 may be connected to each other while surrounding at least a portion of the transmission area TA.

In an embodiment, a first vertical bridge line VBL1 may be formed to include the same material on the same layer as the pair of first horizontal bridge lines HB1 and HB1'. Also, the first vertical bridge line VBL1 and the pair of first horizontal bridge lines HB1 and HB1' may be integrally formed with each other.

The first bridge line BL1 and the first data line DL1 may be arranged on different layers. Thus, the first data line DL1 and the first bridge line BL1 may be connected to each other via a contact hole in an insulating layer (e.g., a second organic insulating layer) between the first data line DL1 and the first bridge line BL1.

Specifically, a first end of the first bridge line BL1 may extend from the upper first horizontal bridge line HB1 so as to intersect the first portion DL1a of the first data line DL1 and may be electrically connected to the first portion DL1a of the first data line DL1 through the upper first contact hole CNT1a. A second end of the first bridge line BL1 may extend from the lower first horizontal bridge line HB1' so as to intersect the second portion DL1b of the first data line DL1 and may be electrically connected to the second portion DL1b of the first data line DL1 through the lower first contact hole CNT1b.

The upper first contact hole CNT1a may be defined in a portion of an insulating layer (e.g., a second organic insulating layer) between the first end of the first bridge line BL1 and the first portion DL1a of the first data line DL1. The lower first contact hole CNT1b may be defined in a portion of an insulating layer (e.g., a second organic insulating layer) between the second end of the first bridge line BL1 and the second portion DL1b of the first data line DL1.

The upper first contact hole CNT1a, which is a connection point of the first bridge line BL1 and the first portion DL1a of the first data line DL1, and the lower first contact hole CNT1b, which is a connection point of the first bridge line BL1 and the second portion DL1b of the first data line DL1, may be located in the display area DA. Because the upper first contact hole CNT1a, the lower first contact hole CNT1b, and the first bridge line BL1 utilize the display area DA, the area of the first non-display area NDA1 that is a dead space may be reduced.

The structure of the first data line DL1 and the first bridge line BL1 may be equally applied to the second through fourth data lines DL2, DL3, and DL4 and the second through fourth bridge lines BL2, BL3, and BL4.

Specifically, the first portion DL2a of the second data line DL2 and the second portion DL2b of the second data line DL2 may be electrically connected to each other through the second bridge line BL2, and the first portion DL3a of the third data line DL3 and the second portion DL3b of the third data line DL3 may be electrically connected to each other through the third bridge line BL3, and the first portion DL4a of the fourth data line DL4 and the second portion DL4b of the fourth data line DL4 may be electrically connected to each other through the fourth bridge line BL4.

The second bridge line BL2 may include a second vertical bridge line VB2 extending in the second direction (e.g., the y direction) and a pair of second horizontal bridge lines HB2 and HB2' disposed at both ends of the second vertical bridge line VB2, respectively, and extending in the first direction (e.g., the x direction). The third bridge line BL3 may include a third vertical bridge line VB3 extending in the second direction (e.g., the y direction) and a pair of third horizontal bridge lines HB3 and HB3' disposed at both ends of the third vertical bridge line VB3, respectively, and extending in the first direction (e.g., the x direction). The fourth bridge line BL4 may include a fourth vertical bridge line VB4 extending in the second direction (e.g., the y direction) and a pair of fourth horizontal bridge lines HB4 and HB4' disposed at both ends of the fourth vertical bridge line VB4, respectively, and extending in the first direction (e.g., the x direction). The second through fourth bridge lines BL2, BL3, and BL4 described above may be configured to connect spaced data lines with respect to the transmission area TA while surrounding at least a portion of the transmission area TA.

In addition, the second through fourth bridge lines BL2, BL3, and BL4 may be arranged on different layers from the second to fourth data lines DL2, DL3, and DL3. Thus, the first through fourth data lines DL2, DL3, and DL4 and the second through fourth bridge lines BL2, BL3, and BL4 may be connected to one another via contact holes of insulating layers between the second through fourth data lines DL2, DL3, and DL4 and the second through fourth bridge lines BL2, BL3, and BL4.

Specifically, both ends of the second bridge line BL2 may extend from a pair of second horizontal bridge lines HB2 and HB2' and may be electrically connected to the first portion DL2a of the second data line DL2 and the second portion DL2b of the second data line DL2 through second contact holes CNT2a and CNT2b. Both ends of the third bridge line BL3 may extend from a pair of third horizontal bridge lines HB3 and HB3' and may be electrically connected to the first portion DL3a of the third data line DL3 and the second portion DL3b of the third data line DL3 through third contact holes CNT3a and CNT3b. Both ends of the fourth bridge line BL4 may extend from a pair of fourth horizontal bridge lines HB4 and HB4' and may be electrically connected to the first portion DL4a of the fourth data line DL4 and the second portion DL4b of the fourth data line DL4 through fourth contact holes CNT4a and CNT4b. Because the second contact holes CNT2a and CNT2b, the third contact holes CNT3a and CNT3b and the fourth contact holes CNT4a and CNT4b are located in the display area DA, the area of the first non-display area NDA1 that is a dead space may be reduced.

Consequently, because lines for bypassing the transmission area TA have to be arranged in order to connect the data lines spaced apart from each other or separated from each other with respect to the transmission area TA, the area of the first non-display area NDA1 increases. Contrary to this, in the display panel according to an embodiment, first portions DL1a, DL2a, DL3a, and DL4a of data lines and second portions DL1b, DL2b, DL3b, and DL4b of data lines, which are separated from each other with respect to the transmission area TA, may be connected to one another by using the first through fourth bridge lines BL1, BL2, BL3, and BL4 arranged in the display area DA. Thus, in the display panel according to an embodiment, an additional space around the transmission area TA for bypassing lines is not required, the area of the dead space such as the first non-display area NDA1 may be reduced. In addition, the effect of simplifying line design of a region around the transmission area TA may be simultaneously implemented.

Figure 8:
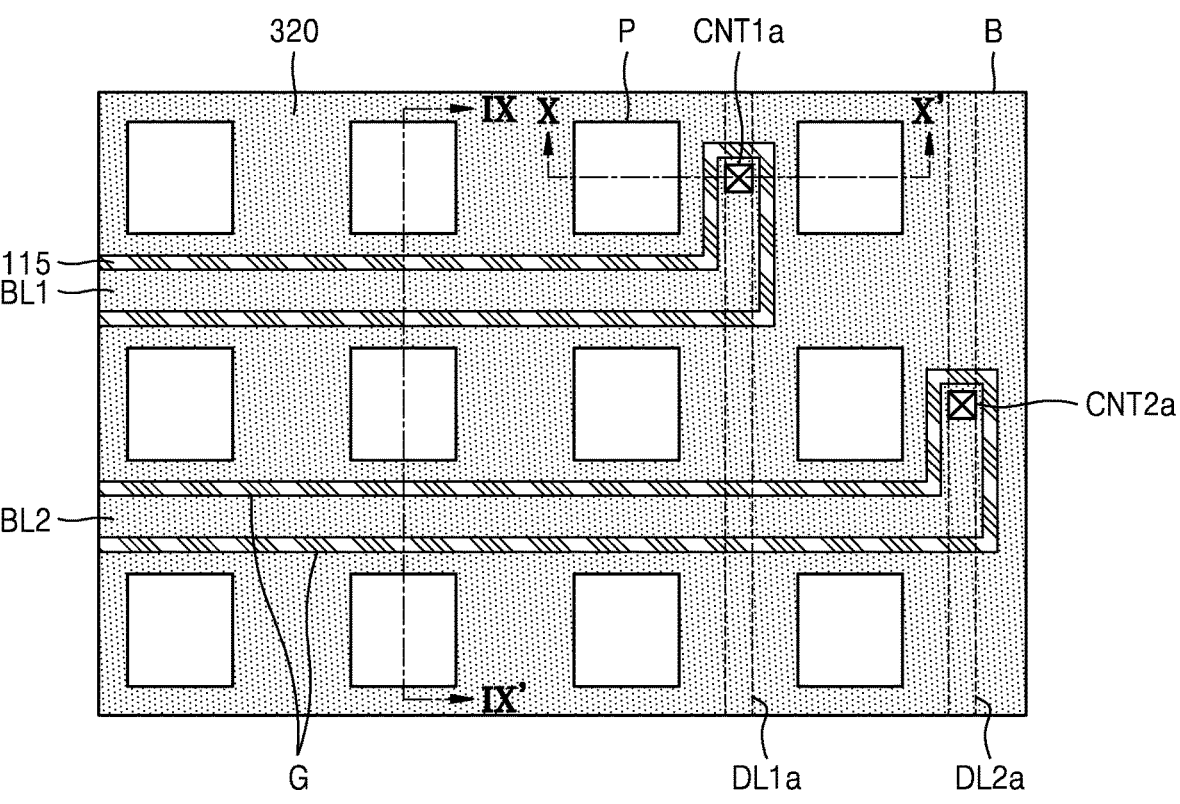
FIG. 8 is a plan view illustrating a portion of the display panel according to an embodiment, which corresponds to portion B of FIG. 7.
Figure 9:
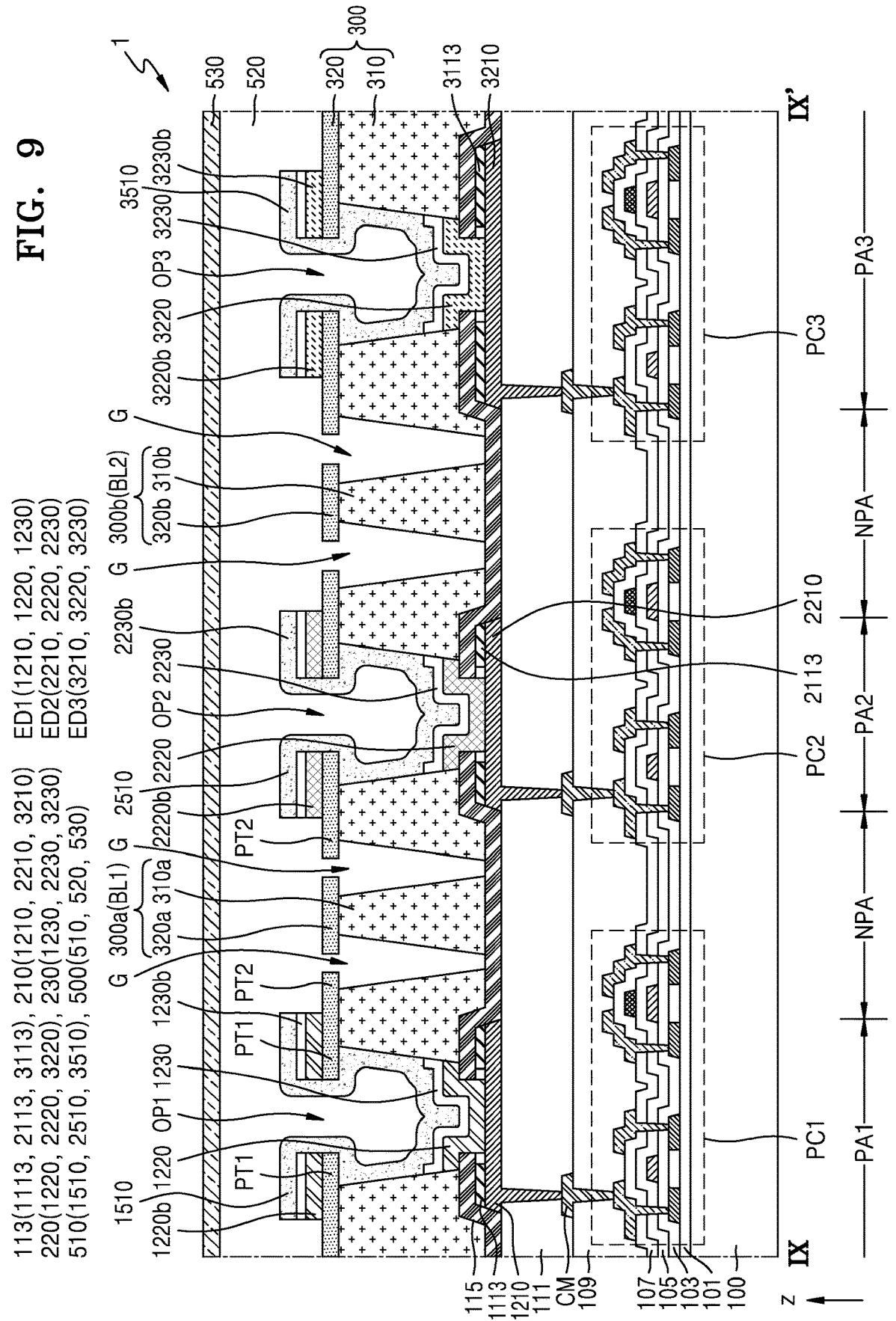
FIG. 9 is a cross-sectional view of the display panel taken along a line IX-IX' of FIG. 8.
Figure 10:
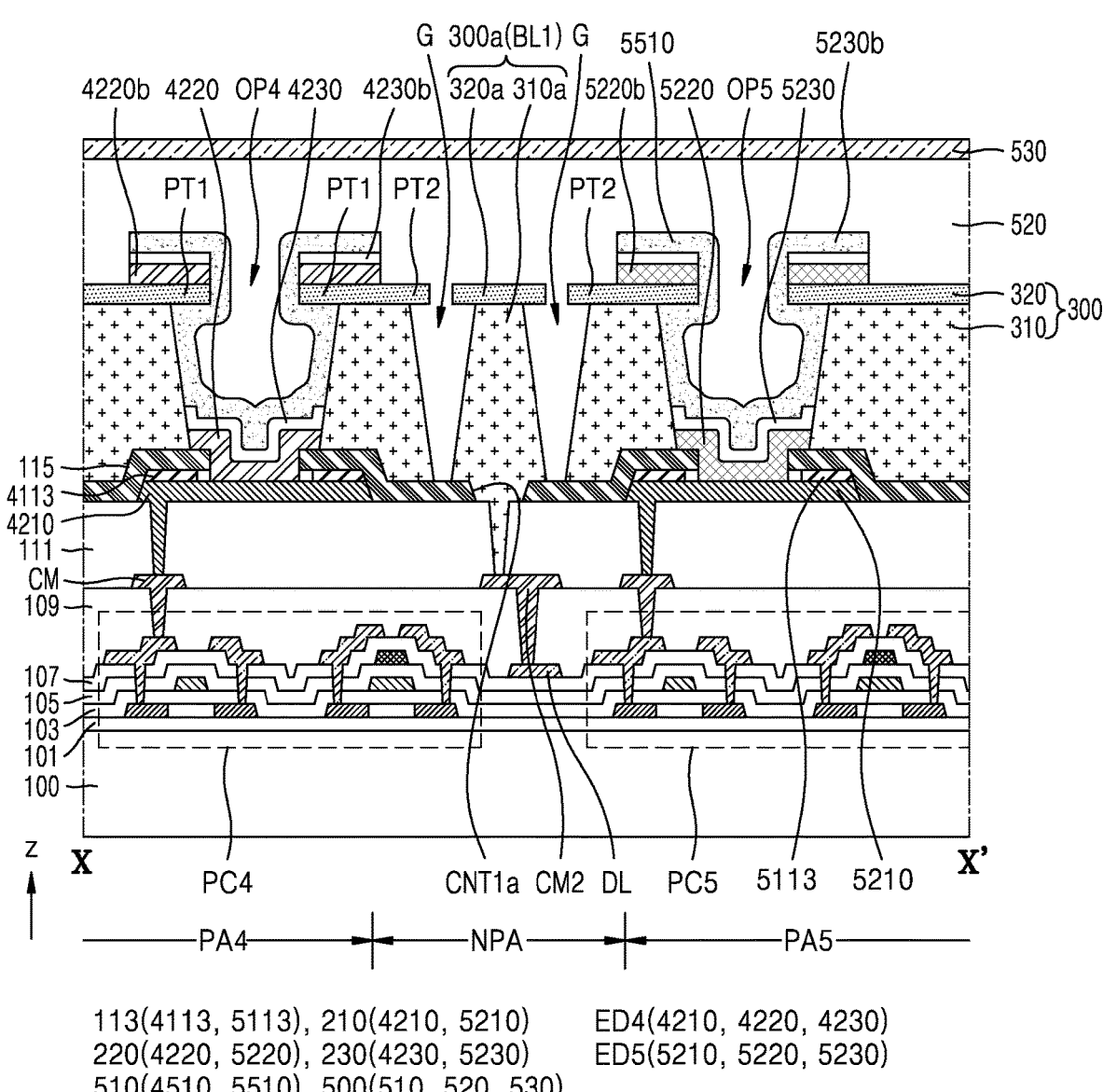
FIG. 10 is a cross-sectional view of the display panel taken along a line X-X' of FIG. 8.

FIG. 8 is a plan view illustrating a portion of a display panel according to an embodiment, which corresponds to a portion B of FIG. 7, and FIG. 9 is a cross-sectional view of the display panel taken along a line IX-IX' of FIG. 8, and FIG. 10 is a cross-sectional view of the display panel taken along a line X-X' of FIG. 9. For convenience of explanation, FIG. 8 schematically illustrates a second metal layer 320, an insulating layer 115, a first bridge line BL1, a second bridge line BL2, sub-pixels P, and the like.

Referring to FIG. 8, a plurality of sub-pixels P may be disposed in the display area DA. A metal bank layer 300 including a first metal layer 310 and the second metal layer 320 may be arranged in a non-sub-pixel area NPA in which the plurality of sub-pixels P are not arranged. Also, data lines DL may be arranged between the plurality of sub-pixels P so that a data signal from the data driving circuit (see 4000 of FIG. 3) may be transmitted to each sub-pixel P. For convenience of explanation, FIG. 8 schematically illustrates only the first data line DL1 and the second data line DL2 as the data lines DL, and data lines may be arranged between the plurality of sub-pixels P, respectively.

However, as described above, some of the data lines DL may be spaced apart from each other with the transmission area TA therebetween and may be separated into first portions DL1a and DL2a of data lines and second portions DL1b and DL2b of data lines. Thus, a bridge line BL may be disposed in the display area DA adjacent to the transmission area TA to connect the separated data lines. That is, the first bridge line BL1 may be configured to connect the first portion DL1a of the first data line DL1 and the second portion DL1b of the first data line DL1, and the second bridge line BL2 may be configured to connect the first portion DL2a of the second data line DL2 and the second portion DL2b of the second data line DL2. The bridge lines BL may be disposed adjacent to the transmission area TA and may surround at least a portion of the transmission area TA.

In this case, the bridge lines BL may be formed by removing a portion of the metal bank layer 300. That is, grooves G may be formed by selective removal of the metal bank layer 300 to define part of the metal bank layer 300 as the bridge lines BL (there is no metal bank layer material in the grooves G). As the bridge lines BL were a part of the metal bank layer 300 before the formation of the grooves G, the bridge lines BL have the same composition as the metal bank layer 300. The grooves G may surround at least portions of the bridge lines BL in a plan view. The bridge lines BL may be spaced apart from the metal bank layer 300 with the grooves G therebetween. The grooves G may be formed by etching the first metal layer 310 and the second metal layer 320 of the metal bank layer 300, and the insulating layer 115 under the metal bank layer 300 may be exposed through the grooves G.

The data lines DL and the bridge lines BL may be arranged on different layers, and the data lines DL and the bridge lines BL may be connected to one another through contact holes of insulating layers between the data lines DL and the bridge lines BL. For example, the first bridge line BL1 may be connected to the first portion DL1a of the first data line DL1 through the upper first contact hole CNT1a, and the second bridge line BL2 may be connected to the first portion DL2a of the second data line DL2 through the upper second contact hole CNT2a. Thus, the first bridge line BL1 may be configured to transmit a data signal between the first portion DL1a of the first data line DL1 and the second portion DL1b of the first data line DL1, and the second bridge line BL2 may be configured to transmit a data signal between the first portion DL2a of the second data line DL2 and the second portion DL2b of the second data line DL2.

Referring to FIG. 9, an electronic apparatus 1 may include first through third sub-pixel areas PA1, PA2, and PA3 and a non-sub-pixel area NPA between adjacent sub-pixel areas. The planar shape of the electronic apparatus 1 may be substantially the same as the planar shape of the substrate 100. Thus, the electronic apparatus 1 including the first through third sub-pixel areas PA1, PA2, and PA3 and the non-sub-pixel area NPA may represent that the substrate 100 includes the first through third sub-pixel areas PA1, PA2, and PA3 and the non-sub-pixel area NPA.

Each of the first through third light emitting diodes ED1, ED2, and ED3 may be arranged on the substrate 100. The first through third light emitting diodes ED1, ED2, and ED3 may be arranged in the first through third sub-pixel areas PA1, PA2, and PA3, respectively.

First through third sub-pixel circuits PC1, PC2, and PC3 may be arranged between the substrate 100 and the first through third light emitting diodes ED1, ED2, and ED3. The first through third sub-pixel circuits PC1, PC2, and PC3 may include the transistors and the storage capacitor described above with reference to FIG. 6A or 4B. In an embodiment, FIG. 9 illustrates that the first through third sub-pixel circuits PC1, PC2, and PC3 have the same structure as the sub-pixel circuit (see PC of FIG. 3) described above with reference to FIG. 6A, and a detailed structure thereof is as described above.

The first through third light emitting diodes ED1, ED2, and ED3 electrically connected to the first through third sub-pixel circuits PC1, PC2, and PC3, respectively, may have a stack structure of a sub-pixel electrode, an intermediate layer, and an opposite electrode.

For example, the first light emitting diode ED1 may include a first sub-pixel electrode 1210, a first intermediate layer 1220, and a first opposite electrode 1230. The first sub-pixel electrode 1210 may be electrically connected to the first sub-pixel circuit PC1. The second light emitting diode ED2 may include a second sub-pixel electrode 2210, a second intermediate layer 2220, and a second opposite electrode 2230. The second sub-pixel electrode 2210 may be electrically connected to the second sub-pixel circuit PC2. The third light emitting diode ED3 may include a third sub-pixel electrode 3210, a third intermediate layer 3220, and a third opposite electrode 3230. The third sub-pixel electrode 3210 may be electrically connected to the third sub-pixel circuit PC3.

Each of the first intermediate layer 1220, the second intermediate layer 2220, and the third intermediate layer 3220 may include a light emitting layer and a first and/or second common layer, as described above with reference to FIG. 3K, and a detailed structure and material are as described above. Here, the light emitting layer of the first intermediate layer 1220, the light emitting layer of the second intermediate layer 2220, and the light emitting layer of the third intermediate layer 3220 may emit pieces of light of different colors.

Each of the first sub-pixel electrode 1210, the second sub-pixel electrode 2210, and the third sub-pixel electrode 3210 may include an inside portion and an outside portion for surrounding the inside portion. In the present specification, "an outside portion (or a peripheral portion) of a sub-pixel electrode" represents "a portion of a sub-pixel electrode including an edge of the sub-pixel electrode", and "an inside portion of the sub-pixel electrode" represents another portion of a sub-pixel area surrounded by the above-described outside portion (or the peripheral portion).

The first intermediate layer 1220 may overlap and contact the inside portion of the first sub-pixel electrode 1210, and the first opposite electrode 1230 may overlap the first intermediate layer 1220. An insulating layer 115 may be disposed on the outside portion of the first sub-pixel electrode 1210. The insulating layer 115 may overlap the outside portion of the first sub-pixel electrode 1210 and may extend to the second organic insulating layer 111 to cover the side surface of the first sub-pixel electrode 1210. A first protection layer 1113 may be disposed between the insulating layer 115 and the outside of the first sub-pixel electrode 1210. The insulating layer 115 and the first protection layer 1113 may be located on the outside portion of the first sub-pixel electrode 1210 and may not be present on the inside portion of the first sub-pixel electrode 1210. In other words, each of the insulating layer 115 and the first protection layer 1113 may include an opening that overlaps the inside portion of the first sub-pixel electrode 1210.

Similarly, the second intermediate layer 2220 may overlap and contact the inside portion of the second sub-pixel electrode 2210, and the second opposite electrode 2230 may overlap the second intermediate layer 2220. An outside portion of the second sub-pixel electrode 2210 may overlap the insulating layer 115. The third intermediate layer 3220 may overlap and contact an inside portion of the third sub-pixel electrode 3210, and the third opposite electrode 3230 may overlap the third intermediate layer 3220. An outside portion of the third sub-pixel electrode 2210 may overlap the insulating layer 115. The insulating layer 115 may overlap the outside portion of each of the second sub-pixel electrode 2210 and the third sub-pixel electrode 3210 and may extend to the second organic insulating layer 111 to cover the side surface of each of the second sub-pixel electrode 2210 and the third sub-pixel electrode 3210. A second protection layer 2113 may be disposed between the insulating layer 115 and the outside portion of the second sub-pixel electrode 2210, and a third protection layer 3113 may be disposed between the insulating layer 115 and the outside portion of the third sub-pixel electrode 3210.

The metal bank layer 300 may include first through third openings OP1, OP2, and OP3 that overlap the first through third sub-pixel electrodes 1210, 2210, and 3210, respectively. The first through third openings OP1, OP2, and OP3 of the metal bank layer 300 of FIG. 9 may have the same structure as the opening (see OP of FIG. 3F) described above with reference to FIG. 6F.

For example, each of the first through third openings OP1, OP2, and OP3 may pass through a bottom surface from an upper surface of the metal bank layer 300 and may have a cross-sectional structure with an undercut shape. The side surface of the first metal layer 310 facing an opening of the first through third openings OP1, OP2, and OP3 of the metal bank layer 300 may have a forward tapered shape and may have an inclination angle that is greater than or equal to about 60° and less than about 90°. The second metal layer 320 of the metal bank layer 300 may include a first tip PT1 extending toward the opening of the first through third openings OP1, OP2, and OP3. The length of the first tip PT1 may be less than about 2 μm. In some embodiments, the length of the first tip PT1 may be about 0.3 μm to about 1 μm, or about 0.3 μm to about 0.7 μm.

In the electronic apparatus 1 according to an embodiment, owing to the structure of the metal bank layer 300 including the first through third openings OP1, OP2, and OP3 having the undercut structure, materials for forming the first through third intermediate layers 1220, 2220, and 3220 and the first through third opposite electrodes 1230, 2230, and 3230 may be deposited without using an additional mask. Thus, the damage of the electronic apparatus 1 using the mask may be prevented.

Because a material for forming an intermediate layer and a material for forming an opposite electrode are deposited using a mask, the material for forming the intermediate layer and the material for forming the opposite electrode may be deposited in the opening of the first through third openings OP1, OP2, and OP3 and may also be deposited on the metal bank layer 300. At least one dummy intermediate layer and at least one dummy opposite electrode may be arranged on the metal bank layer 300. At least one dummy intermediate layer may be separated and spaced apart from the first through third intermediate layers 1220, 2220, and 3220 located in the first through third openings OP1, OP2, and OP3, respectively. At least one dummy opposite electrodes may be separated and spaced apart from the first through third intermediate layers 1220, 2220, and 3220 located in the first through third openings OP1, OP2, and OP3, respectively. For example, the dummy intermediate layer may include a first dummy intermediate layer 1220b, a second dummy intermediate layer 2220b, and a third dummy intermediate layer 3220b, and the dummy opposite electrode may include a first dummy opposite electrode 1230b, a second dummy opposite electrode 2230b, and a third dummy opposite electrode 3230b.

The first opposite electrode 1230 disposed in the first opening OP1 of the metal bank layer 300, the second opposite electrode 2230 disposed in the second opening OP2 of the metal bank layer 300, and the third opposite electrode 3230 disposed in the third opening OP3 of the metal bank layer 300 may be spatially separated or spaced apart from one another. The first opposite electrode 1230, the second opposite electrode 2230, and the third opposite electrode 3230 may be electrically connected to one another and may have the same voltage level. For example, each of the first opposite electrode 1230, the second opposite electrode 2230, and the third opposite electrode 3230 may have the same voltage level as a voltage (e.g., a common voltage) provided by the common voltage line VSSL. Each of the first through third opposite electrodes 1230, 2230, and 3230 may be electrically connected to a vertical common voltage line VSL or a horizontal common voltage line HSL through the metal bank layer 300.

For example, the outside portion of the first opposite electrode 1230 may be electrically connected (e.g., in direct contact with) the side surface (e.g., the side surface of the first metal layer 310) of the metal bank layer 300 facing the first opening OP1, and the metal bank layer 300 is electrically connected to one portion of the common voltage line VSL so that the first opposite electrode 1230 may receive the common voltage. Similarly, as the outside portion of the second opposite electrode 2230 and the outside portion of the third opposite electrode 3230 are in direct contact with the side surface of the metal bank layer 300 facing the second opening OP2 and the third opening OP3 and the metal bank layer 300 are electrically connected to one portion of the common voltage line VSL, the second opposite electrode 2230 and the third opposite electrode 3230 may receive the common voltage.

The first through third light emitting diodes ED1, ED2, and ED3 may be encapsulated by the encapsulation layer 500. In an embodiment, FIG. 9 illustrates that the encapsulation layer 500 includes a first inorganic encapsulation layer 510, an organic encapsulation layer 520 on the first inorganic encapsulation layer 510, and a second inorganic encapsulation layer 530 on the organic encapsulation layer 520. The materials for forming the first inorganic encapsulation layer 510, the organic encapsulation layer 520, and the second inorganic encapsulation layer 530 are as described above with reference to FIG. 6J.

The first inorganic encapsulation layer 510 may be configured to cover a structure and/or a layer under the first inorganic encapsulation layer 510. For example, the first inorganic encapsulation layer 510 having a relatively excellent step coverage may be configured to cover the internal structure and/or layer of each of the first through third openings OP1, OP2, and OP3 and grooves G to be described below. The first inorganic encapsulation layer 510 may include a first sub-pixel inorganic encapsulation layer 1510 disposed in the first sub-pixel area PA1, a second sub-pixel inorganic encapsulation layer 2510 disposed in the second sub-pixel area PA2, and a third sub-pixel inorganic encapsulation layer 3510 disposed in the third sub-pixel area PA3. The first sub-pixel inorganic encapsulation layer 1510, the second sub-pixel inorganic encapsulation layer 2510, and the third sub-pixel inorganic encapsulation layer 3510 may include the same material. The first inorganic encapsulation layer may be configured to overlap (or cover) upper surfaces and side surfaces of the first through third opposite electrodes 1230b, 2230b, and 3230b, side surfaces of the first through third dummy intermediate layers 1220b, 2220b, and 3220b, the side surface and the bottom surface of the second metal layer 320 corresponding to the first tip PT1, the side surface of the first metal layer 310, and upper surfaces of the first through third opposite electrodes 1230, 2230, and 3230.

A portion of the organic encapsulation layer 520 may fill at least partially each of the first through third openings OP1, OP2, and OP3. Another portion of the organic encapsulation layer 520 may fill at least partially each of the grooves G. The insulating layer 115 and the organic encapsulation layer 520 may be in direct contact with each other through the grooves G of the metal bank layer 300. The second inorganic encapsulation layer 530 may be formed on the organic encapsulation layer 520.

The metal bank layer 300 may include the grooves G and the dummy metal bank layers 300a and 300b in addition to the first through third openings OP1, OP2, and OP3. The grooves G and the dummy metal bank layers 300a and 300b may be arranged between light emitting diodes arranged in the display area DA adjacent to the transmission area TA, i.e., in the non-sub-pixel area NPA.

The grooves G may have a concave shape with respect to an upper surface of the metal bank layer 300. The grooves G may have an undercut shape like in the first through third openings OP1, OP2, and OP3. A portion of the second metal layer 320 of the metal bank layer 300 may include a second tip PT2 that protrudes toward the grooves G. Because the grooves G may be formed by etching the first metal layer 310 and the second metal layer 320 of the metal bank layer 300, the insulating layer 115 may be exposed through the grooves G. That is, the bottom surface of the grooves G may be substantially the same as the upper surface of the insulating layer 1150. However, embodiments are not limited thereto, and the metal bank layer 300 and the insulating layer 115 may be etched through the grooves G so that the upper surface of the second organic insulating layer 111 may be exposed through the grooves G.

By the grooves G formed by etching a portion of the metal bank layer 300, the first dummy metal bank layer 300a and the second dummy metal bank layer 300b may be separated from the metal bank layer 300. That is, the first dummy metal bank layer 300a may be spaced apart from the metal bank layer 300 with the grooves G therebetween, and the second dummy metal bank layer 300b may be spaced apart from the metal bank layer 300 with the grooves G therebetween. Thus, the first dummy metal bank layer 300a may include a (1-1)th dummy metal layer 310a including the same material as the first metal layer 310 and a (2-1)th dummy metal layer 320a including the same material as the second metal layer 320. The second dummy metal bank layer 300b may include a (1-2)th dummy metal layer 310b including the same material as the first metal layer 310 and a (2-2)th dummy metal layer 320a including the same material as the second metal layer 320.

By the grooves G, the dummy metal bank layers 300a and 300b spaced apart from the metal bank layer 300 may function as a bridge line BL. For example, the first dummy metal bank layer 300a may be used as a first bridge line BL1, and the second dummy metal bank layer 300b may be used as a second bridge line BL2. Thus, the grooves G may be formed to surround each of the bridge lines BL at least partially, as shown in FIG. 8, in a plan view. However, in order for the dummy metal bank layers 300a and 300b to function as the bridge lines BL, the dummy metal bank layers 300a and 300b need to be electrically connected to the data lines DL.

Referring to FIG. 10, an electronic apparatus 1 may include a fourth sub-pixel area PA4, a fifth sub-pixel area PA5, and a non-sub-pixel area NPA between adjacent sub-pixel areas. A fourth light emitting diode ED4 and a fifth light emitting diode ED5, which are arranged in the fourth sub-pixel area PA4 and the fifth sub-pixel area PA5, respectively, have the same structure as the of the first through third light emitting diodes ED1, ED2, and ED3 described above with reference to FIG. 9, and a detailed structure thereof is as described above. A fourth sub-pixel circuit PC4 and a fifth sub-pixel circuit PC5, which are arranged in the fourth sub-pixel area PA4 and the fifth sub-pixel area PA5, respectively, have the same structure as that of the sub-pixel circuit (see PC of FIG. 3) described above with reference to FIG. 6A, and a detailed structure thereof is as described above.

In this case, the data lines DL may be arranged in the non-sub-pixel area NPA between the fourth sub-pixel circuit PC4 and the fifth sub-pixel circuit PC5. The data lines DL may be arranged adjacent to the sub-pixel circuits PC arranged in each pixel and may be configured to transmit a data signal to each of the sub-pixel circuits PC. The data lines DL may be arranged on the same layer (e.g., the second interlayer insulating layer 107) as the source electrode S1 and/or the drain electrode D1 of the sub-pixel circuit PC and may include the same material as that of the source electrode S1 and/or the drain electrode D1. For example, the data line DL may include Al, Cu and/or Ti and may have a single layer or multi-layered structure including the above-described materials.

The data line DL may be electrically connected to the first dummy metal bank layer 300a with an insulating layer, for example, a first organic insulating layer 109, a second organic insulating layer 111, and an insulating layer 115 interposed therebetween. Specifically, the data line DL may be electrically connected to the first dummy metal bank layer 300a through the upper first contact hole CNT1a formed in the insulating layer.

In this case, the data line DL may be in direct contact with the first dummy metal bank layer 300a or may be electrically connected to the first dummy metal bank layer 300a through a conductive metal CM2 between the data line DL and the first dummy metal bank layer 300a, as shown in FIG. 10. That is, a portion of the first dummy metal bank layer 300a used as the first bridge line BL1 and a portion of the data line DL may be electrically connected to each other via the conductive metal CM2. The conductive metal CM2 may be arranged on the same layer as the connective metal CM and may include the same material. The connective metal CM may include Al, Cu and/or T, and may have a single layer or multi-layered structure including the above-described materials.

As described above, in an electronic apparatus according to an embodiment of the present disclosure, a light emitting layer can be patterned by using a metal bank layer so that resolution can be improved and an image of excellent quality can be provided. In addition, in a structure in which a transmission area corresponding to various components such as a camera is disposed in a display area, the area of a dead space can be minimized by replacing a hole bypass wire using a part of the metal bank layer. However, the above-described effects are merely illustrative, and the scope of the present disclosure is not limited thereby.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   sub-pixel electrodes;
   a metal bank layer on the sub-pixel electrodes, the metal bank layer comprising openings on the sub-pixel electrodes and a groove between sub-pixel electrodes, the metal bank layer being absent in the openings and the groove;
   an insulating layer on the sub-pixel electrodes and under the metal bank layer;
   a bridge line disposed on the insulating layer between the sub-pixel electrodes, wherein the bridge line includes the same material as the metal bank layer;
   an intermediate layer on the sub-pixel electrodes in the openings of the metal bank layer; and
   an opposite electrode disposed on the intermediate layer in the openings of the metal bank layer,
   wherein, in a plan view, the groove surrounds at least a portion of the bridge line.

2. The display panel of claim 1, wherein the opposite electrode is in contact with a side surface of the metal bank layer.

3. The display panel of claim 1, wherein each of the metal bank layer and the bridge line comprises a first metal layer and a second metal layer having different compositions.

4. The display panel of claim 3, wherein a portion of the second metal layer of the metal bank layer comprises a tip extending from a point where a bottom surface of the second metal layer and a side surface of the first metal layer contact each other toward each of the opening and the groove.

5. The display panel of claim 1, wherein the groove extends between the bridge line and the metal bank layer.

6. The display panel of claim 1, further comprising a substrate comprising a transmission area and a display area surrounding the transmission area, wherein the bridge line is disposed adjacent to the transmission area and surrounds at least a portion of the transmission area.

7. The display panel of claim 6, further comprising:
a thin film transistor electrically connected to a light emitting diode, wherein the light emitting diode comprises at least one of the sub-pixel electrodes, the intermediate layer, and the opposite electrode; and
a scan line and a data line configured to supply a signal to the thin film transistor,
wherein the scan line extends in a first direction, and the data line extends in a second direction crossing the first direction, and the bridge line is electrically connected to the data line.

8. The display panel of claim 7, wherein some of the data lines are spaced apart from each other with the transmission area therebetween and is separated into a first portion of the data line and a second portion of the data line, and the bridge line is configured to electrically connect the first portion of the data line to the second portion of the data line.

9. The display panel of claim 7, wherein the data line and the bridge line are disposed on different layers, and the data line and the bridge line are connected to each other via a contact hole in an insulating layer between the data line and the bridge line.

10. The display panel of claim 9, wherein the contact hole is around the peripheral transmission area.

11. The display panel of claim 9, further comprising a conductive metal interposed between a portion of the bridge line and a portion of the data line, wherein a portion of the bridge line and a portion of the data line are electrically connected to each other by the conductive metal.

12. The display panel of claim 7, wherein the bridge line comprises a horizontal bridge line extending in the first direction and a vertical bridge line extending in the second direction.

13. The display panel of claim 12, wherein the horizontal bridge line and the vertical bridge line are arranged on a same layer, and the horizontal bridge line and the vertical bridge line are integrally formed with each other.

14. The display panel of claim 1, further comprising:
a first inorganic encapsulation layer configured to cover at least a portion of an inner surface of the opening of the metal bank layer;
an organic encapsulation layer disposed on the first inorganic encapsulation layer; and
a second inorganic encapsulation layer disposed on the organic encapsulation layer,
wherein the insulating layer and the organic encapsulation layer are in direct contact with each other through the groove in the metal bank layer.

15. An electronic apparatus comprising:
a display panel comprising a transmission area and a display area surrounding the transmission area; and
a component disposed on a rear surface of the display panel and corresponding to the transmission area,
wherein the display panel comprises:
sub-pixel electrodes;

a metal bank layer on the sub-pixel electrodes, the metal bank layer comprising openings on the sub-pixel electrodes and a groove between sub-pixel electrodes, the metal bank layer being absent in the openings and the groove;
an insulating layer on the sub-pixel electrodes and under the metal bank layer;
a bridge line disposed on the insulating layer between the sub-pixel electrodes, wherein the bridge line includes a same material as the metal bank layer;
an intermediate layer on the sub-pixel electrodes in the opening of the metal bank layer; and
an opposite electrode disposed on the intermediate layer in the openings of the metal bank layer,
wherein the bridge line is spaced apart from the metal bank layer with the groove therebetween.

16. The electronic apparatus of claim 15, wherein the opposite electrode is in contact with a side surface of the metal bank layer.

17. The electronic apparatus of claim 15, wherein each of the metal bank layer and the bridge line comprises a first metal layer and a second metal layer having different compositions, and a portion of the second metal layer comprises a tip extending from a point where a bottom surface of the second metal layer and a side surface of the first metal layer contact each other toward each of the opening and the groove.

18. The electronic apparatus of claim 15, wherein the bridge line is disposed adjacent to the transmission area and surrounds at least a portion of the transmission area.

19. The electronic apparatus of claim 15, wherein a thin film transistor electrically connected to a light emitting diode, wherein the light emitting diode comprises at least one of the sub-pixel electrodes, the intermediate layer, and the opposite electrode; and
a scan line and a data line configured to supply a signal to the thin film transistor,
wherein the scan line extends in a first direction, and the data line extends in a second direction crossing the first direction, and the bridge line is electrically connected to the data line.

20. The electronic apparatus of claim 19, wherein some of the data lines are spaced apart from each other with the transmission area therebetween and is separated into a first portion of the data line and a second portion of the data line, and the bridge line is configured to electrically connect the first portion of the data line to the second portion of the data line.

21. The electronic apparatus of claim 19, wherein the data line and the bridge line are disposed on different layers, and the data line and the bridge line are connected to each other via a contact hole in an insulating layer between the data line and the bridge line.

22. The electronic apparatus of claim 21, wherein a conductive metal interposed between a portion of the bridge line and a portion of the data line, wherein a portion of the bridge line and a portion of the data line are electrically connected to each other by the conductive metal.

23. The electronic apparatus of claim 19, wherein the bridge line comprises a horizontal bridge line extending in the first direction and a vertical bridge line extending in the second direction, and the horizontal bridge line and the vertical bridge line are arranged on a same layer, and the horizontal bridge line and the vertical bridge line are integrally formed with each other.

24. The electronic apparatus of claim 15, wherein the component comprises a sensor or a camera.

* * * * *